United States Patent
Iihola et al.

(10) Patent No.: US 9,969,615 B2
(45) Date of Patent: May 15, 2018

(54) MANUFACTURING METHOD OF A MULTI-LEVEL MICROMECHANICAL STRUCTURE ON A SINGLE LAYER OF HOMOGENOUS MATERIAL

(71) Applicant: MURATA MANUFACTURING CO., LTD., Nagaokakyo-shi, Kyoto (JP)

(72) Inventors: Antti Iihola, Helsinki (FI); Altti Torkkeli, Tuusula (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days. days.

(21) Appl. No.: 15/147,233

(22) Filed: May 5, 2016

(65) Prior Publication Data

US 2016/0332872 A1 Nov. 17, 2016

(30) Foreign Application Priority Data

May 15, 2015 (FI) .................................. 20155352

(51) Int. Cl.
*H01L 21/00* (2006.01)
*B81C 1/00* (2006.01)
(Continued)

(52) U.S. Cl.
CPC ...... *B81C 1/00595* (2013.01); *B81C 1/00603* (2013.01); *G01C 19/5733* (2013.01);
(Continued)

(58) Field of Classification Search
CPC .... B81B 2201/0235; B81B 2201/0242; B81B 2201/033; B81B 2203/0136;
(Continued)

(56) References Cited

U.S. PATENT DOCUMENTS 6,074,890 A 6/2000 Yao et al.
6,887,391 B1 5/2005 Daneman et al.
(Continued)

FOREIGN PATENT DOCUMENTS

EP 1 798 195 A2 6/2007
EP 1 857 821 A2 11/2007
(Continued)

OTHER PUBLICATIONS

Taiwanese Search Report application No. 105113943 dated Jan. 5, 2017.
(Continued)

*Primary Examiner* — Duy T Nguyen
(74) *Attorney, Agent, or Firm* — Squire Patton Boggs (US) LLP

(57) ABSTRACT

A method for manufacturing a micromechanical device layer is performed on a device wafer comprising a single layer of homogenous material. The method comprises patterning a first mask on a first face of the device wafer, the first mask patterning at least lateral dimensions of comb structures and outlines of large device structures. First trenches are etched, the first trenches defining the lateral dimensions of the at least comb structures and outlines of large device structures in a single deep etching process. Recession etching may be used on one or two faces of the device wafer for creating structures at least partially recessed below the respective surfaces of the device wafer. A double mask etching process may be used on one or two faces of the device wafer for creating structures at least partially recessed to mutually varying depths from the respective face of the device wafer.

20 Claims, 14 Drawing Sheets

(51) Int. Cl.
*G01C 19/5733* (2012.01)
*G01C 19/5769* (2012.01)

(52) U.S. Cl.
CPC .. *G01C 19/5769* (2013.01); *B81B 2201/0235* (2013.01); *B81B 2201/0242* (2013.01); *B81B 2201/033* (2013.01); *B81B 2203/0136* (2013.01)

(58) Field of Classification Search
CPC ............ B81C 1/00595; B81C 1/00603; G01C 19/5733; G01C 19/5769
USPC .......................................................... 438/50
See application file for complete search history.

(56) References Cited

U.S. PATENT DOCUMENTS

| | | | |
|---|---|---|---|
| 7,088,030 | B2 | 8/2006 | Hsieh et al. |
| 7,214,559 | B2 | 5/2007 | Kim et al. |
| 2001/0044165 | A1 | 11/2001 | Lee et al. |
| 2002/0005976 | A1 | 1/2002 | Behin et al. |
| 2002/0011759 | A1 | 1/2002 | Adams et al. |
| 2002/0158293 | A1 | 10/2002 | Lee et al. |
| 2002/0164833 | A1 | 11/2002 | Cho et al. |
| 2004/0121506 | A1 | 6/2004 | Gogoi |
| 2006/0096377 | A1 | 5/2006 | Gogoi |
| 2006/0284514 | A1 | 12/2006 | Ko et al. |
| 2007/0119252 | A1 | 5/2007 | Adams et al. |
| 2007/0128831 | A1 | 6/2007 | Oka |
| 2008/0151345 | A1 | 6/2008 | Zhou |
| 2008/0290494 | A1 | 11/2008 | Lutz et al. |
| 2009/0199637 | A1 | 8/2009 | Sugiura et al. |
| 2010/0117167 | A1 | 5/2010 | Yokura et al. |
| 2010/0326191 | A1* | 12/2010 | Foster ................ G01C 19/5719 73/514.29 |
| 2011/0034031 | A1 | 2/2011 | Kanamori et al. |

FOREIGN PATENT DOCUMENTS

| | | |
|---|---|---|
| KR | 10-0817813 B1 | 3/2008 |
| WO | WO 99/36948 A1 | 7/1999 |

OTHER PUBLICATIONS

U.S. Office Action application No. 15/147,197 dated Jan. 3, 2017.
Finnish Search Report dated Nov. 6, 2015 corresponding to Finnish Patent Application No. 20155352.
Finnish Search Report dated Jan. 14, 2016 corresponding to Finnish Patent Application No. 20155843.
International Search Report application No. PCT/IB2016/052630 dated Sep. 8, 2016.
International Search Report application No. PCT/IB2016/052629 dated Sep. 12, 2016.

* cited by examiner

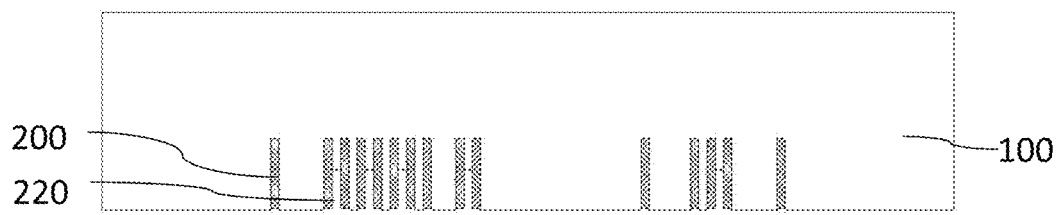
Figure 2a
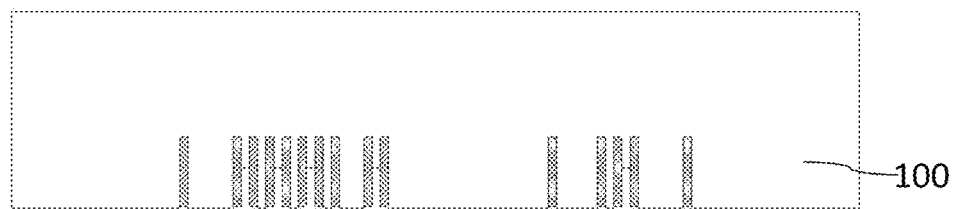
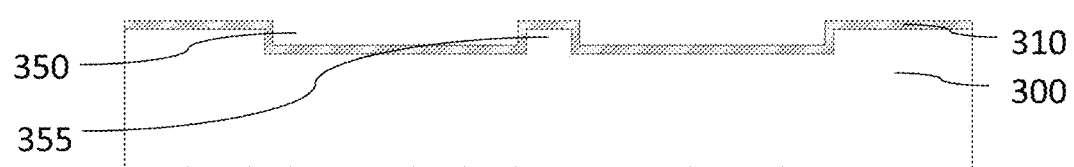
Figure 2b
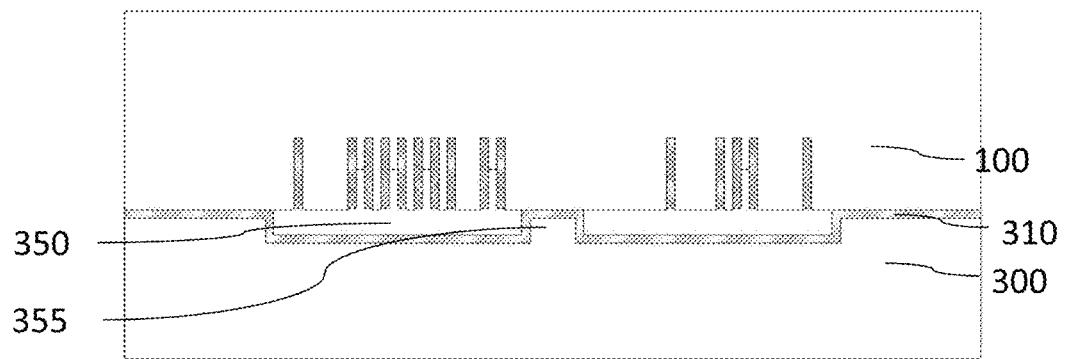
Figure 2c
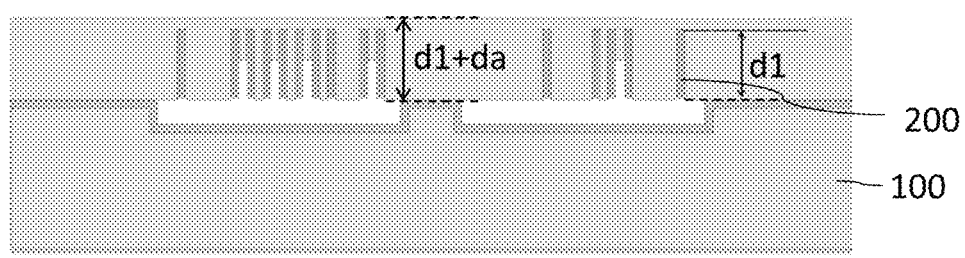
Figure 2d (optional)

Figure 2e (optional)

MANUFACTURING METHOD OF A MULTI-LEVEL MICROMECHANICAL STRUCTURE ON A SINGLE LAYER OF HOMOGENOUS MATERIAL

BACKGROUND

Field

The present invention relates to a manufacturing method of microelectromechanical (MEMS) devices and especially to manufacturing a micromechanical device layer as defined herein. This application claims foreign priority to Finland Patent Application Number 20155352, filed on 15 May 2015, entitled "A multi-level micromechanical structure and a manufacturing method thereof," which is hereby incorporated by reference in its entirety.

Description of the Related Art

A Micro-Electro-Mechanical System (MEMS) device has moving elements under control of integrated microelectronics and contains micro-circuitry on a tiny silicon chip into which some mechanical device, such as a micro sensor, and a micro actuator has been manufactured. These micro sensors and micro actuators constitute functional elements of micro-electromechanical (MEMS) devices. The physical dimensions of MEMS devices can vary from below one micron to several millimeters.

MEMS devices convert a measured mechanical signal into an electrical signal. MEMS sensors measure a mechanical phenomenon and the related electronics then process the information derived from the sensor elements and through some decision making capability direct the actuators to respond by e.g. moving, positioning, or regulating in order to thereby control the environment for some desired outcome or purpose. MEMS devices can thus comprise both drive elements and sensing elements to perform specific functions.

Examples of systems fabricated using MEMS technology are pressure sensors, accelerators for measuring acceleration of moving objects, micropositioners, such as micromirrors, optical switches or scanners, and gyroscopes for measuring angular velocity of rotating objects.

MEMS devices might be capacitive or make use of piezoelectric transduction.

A key element in a capacitive MEMS device is a variable capacitor formed between two electrodes. These may comprise a stationary electrode and a movable electrode attached to a suspended proof mass. Alternatively the device may comprise two movable electrodes. An inertial mass, and the movable electrode attached to it deflects in response to acceleration in an accelerator or Coriolis force exerted on the inertial mass when an angular velocity is applied to a gyroscope and used for measuring this velocity. The amount of deflection can be sensed from changes in capacitance from the changes in the gap between the two electrodes due to deflection. The change in capacitance can be produced by the change in overlapping area between the fixed and movable electrodes as well. In case of vertical movement the actuation and sensing is typically realized by comb designs, where one comb pair is fixed to the substrate and other comb pair is able to move on Z-direction through a spring structure. Moreover, when the fixed and movable combs have offset in vertical direction, the direction of movement can be measured in a linear manner by various design and measurement arrangement.

Accelerometers are acceleration sensors. An inertial mass suspended by springs is acted upon by acceleration forces that cause the inertial mass to be deflected from its initial position. This deflection is converted to an electrical signal, which appears at the sensor output.

An accelerometer comprises an inertial mass, one side of which is fixed to a carrier while the other is suspended. It further comprises means for detecting the movement of the membrane under the effect of acceleration. This constitutes a sensor, which senses acceleration force.

Inertial sensors are a type of accelerometer and are one of the principal commercial products that utilize surface micro machining.

When things rotate around an axis they have angular velocity. Gyroscopes, or gyros, are devices that measure or maintain rotational motion. In MEMS devices, vibration is typically used as primary motion of the gyroscope. In a vibrating sensor of angular velocity, for example a gyroscope, a certain known primary motion is induced and maintained in the sensor. When a mass is vibrating in one direction called the primary motion and rotational angular velocity is applied, the mass experiences a force in orthogonal direction as a result of the Coriolis force. Resulting physical displacement caused by the Coriolis force may be then read from, for example, a capacitive, piezoelectrical or piezoresistive sensing structure.

When MEMS technology is used to implement gyroscopes, these have an inertial structure suspended above a substrate and associated electronics that both senses movement of the suspended inertial structure and deliver the electrical signal caused by the sensed movement to an external computer. The computer processes the sensed data to calculate the property being measured.

Structures for vibrating gyroscopes are formed e.g. by etching a semiconductor wafer to form a proof mass used as a reference in the measurement. The proof mass is suspended by a spring system, such as elastic beams, to a substrate. An electronic drive circuit which may be on the same substrate applies an alternating drive current to driving electrodes which vibrate the proof mass in a drive direction. The electrical drive mechanism vibrates the proof mass along a drive axis and the electrodes build a capacitance together with the proof mass for detecting motion of the proof mass along a sense axis perpendicular to the drive axis. A triple axis MEMS gyroscope can measure rotation around three mutually orthogonal axes, while single and dual axis gyros measure the rotation around one or two of these axes.

Comb structures may be utilized in sensor devices for detection and/or driving purposes. Comb structures may also be used as actuators, a.k.a. comb drivers in a micromechanical device for various purposes. A comb structure typically includes at least one stator, in other words a non-moving part and a rotor, in other words a moving part. Typically, stator(s) and rotor(s) of a comb structure include two or more so called comb fingers, which can be described as longitudinal extensions of the structure, which may gave varying shape, length and width. A reason for including such fingers in a comb structure is for increasing surface area of electrodes mutually affecting each other, enabling for instance greater forces between electrodes. A voltage difference applied to a comb structure may drive micro motors and micro positioning devices, such as micro mirrors, optical switches, optical guides, scanners, laser printers, wavelength-selective switches, diffraction gratings and so on as known by a person skilled in the art.

Term die refers to one small block of the semiconducting material, on which a given functional circuit, a chip, is fabricated. In the manufacturing of the micro-electronic devices, each individual die contains one of the integrated circuits. During manufacturing, a wafer with up to thousands of circuits is cut into rectangular pieces, each called a die. The integrated circuits are produced in large batches on a single wafer.

Etching is a critically important process module, and every wafer undergoes many etching steps before it is complete. For many etch steps, part of the wafer is protected from the etchant by a "masking" material which resists etching. The masking material is e.g. a photoresist which has been patterned using photolithography. The patterning shows which parts of the wafer should be etched.

In anisotropic etching, the etching rate is different in horizontal and vertical direction.

US2006/0284514 presents an actuator having a vertical comb electrode structure. This actuator is manufactured in a two side etching process, which leads to having insulation layer in the fixed comb electrodes.

U.S. Pat. No. 7,088,030 presents a HARM structure where the formed comb structures have lateral strengthening structure formed at vertically peripheral walls.

A problem relating to this prior art is that while the comb structures are not formed of homogenous material, the accuracy of the comb electrodes is not optimal. While different materials have different electron affinity, the non-homogenous materials have electrostatic differences and some electronic biasing arrangements may be required for the comb structure in order to compensate any unwanted potential differences between the comb fingers caused by the materials. Similar problem arises even if different parts or portions of the die material in the comb structures is processed with different processing methods causing the remaining electrodes having different or varying surface structure.

EP1798195 presents a comb-type electrode structure where two electrodes have been manufactured from two different substrates. Although the two substrates may be of same material and processed by similar process, combining two separately created layers of die always induces problems with alignment of the two layers, which has to be taken into account in the design of the electrodes: required tolerances are high which leads to bulky designs and ineffective use of the die area. Any misalignment occurring in placement of the layers will cause decreased accuracy for the comb electrode.

SUMMARY

One object of the present invention is to provide a method and apparatus so as to overcome the prior art disadvantages.

The preferred embodiments of the invention are disclosed in the dependent claims.

Present invention is based on an idea of generating self-aligned critical structures on a single layer of device wafer. The critical pattern is transferred to the device wafer with one deep silicon etching process, through a single homogenous material layer. This way a device layer structure can be created that has homogenous material, avoiding any need for electrical biasing due to electrostatic differences between materials in the device layer, and even the vertical surfaces of the created structures are uniform, thus avoiding any unwanted electrical phenomena on the surface due to varying surface structure. Using a single mask for generation of the critical structures enables very high accuracy in creation of lateral dimensions. No horizontal displacement is caused in the manufacturing process between the vertical moving structures due to misalignment of multiple masks, since all lateral dimensions are defined by a single mask. Lateral accuracy is limited only by the accuracy of the lithography masking and the etching process. Accurate dimensions of detection comb structures enable extremely precise and efficient capacitive detection. Small and dense comb structures may be created with high accuracy.

Using a method that enables a structure made of homogenous material allows optimizing the material for the specific use. With homogenous material we mean that the material composition or structure does not change within the volume of the material, but the homogenous material does not have to comprise only a single chemical element, but may comprise a compound or mixture of multiple ingredients. When the device layer material is homogenous its properties can be designed and application specifically tailored in advance to meet the requirements needed for best performance. Typical wafer material is based on silicon, but even a silicon wafer may comprise additional materials. For example, doping level, growth method, crystal orientation and ingredient content ratios in the die material such as oxygen or carbon can be selected in detail. It should be understood, that a device layer should be considered homogenous although a small amount of impurities would be found within the volume or at the surfaces of the device layer material.

The accuracy of the critical structures is improved by the method by generating the pattern of the critical structures on a planar surface, so that best accuracy patterning materials and methods may be utilized.

The method applies equally to inertial or movable parts of a micromechanical sensor device as well as movable parts of a micromechanical actuator structure. In the following description, we'll use a common terms movable parts or movable elements interchangeably for any such parts, elements or structures in a micromechanical device that are capable of moving or deforming. Typically, these elements are part of the device layer of the micromechanical device.

The term "face" may refer to a face of a device wafer. The device wafer is a relatively thin and essentially flat wafer consisting of single, uniform material, which initially has two faces each forming a flat surface on which the processing steps may be performed. Term surface refers to a top layer or a top plane of a face of the device wafer or a device layer. At least one surface of the device wafer may change during the manufacturing process from the original surface of the device wafer prior to processing the device wafer, when the device wafer is for example grinded or polished for removing material from a face of the device wafer. Also partial etching may be performed to remove material from a face of the device wafer. Surface of the device layer refers to a two top surface of a finalized device layer. The device layer may be considered to have two faces similarly to the device wafer. A recessed structure refers to a structure having a face that is recessed below a respective surface of the device layer. A recessed structure may be recessed from one or both surfaces of the device layer.

An embodiment of the method further enables creating a multi-layer comb structure allowing very accurate fully linear detection with differential sensing in the z-axis direction. Compared to a traditional, one- or two-layer comb structure, by introducing a multi-layer (for example three-layer) comb structure, the area required for a comb structure capable of fully linear detection is significantly reduced.

According to a first aspect, a method for manufacturing a micromechanical device layer is provided, the method being performed on a device wafer comprising a single layer of homogenous material. The method comprises patterning a first mask on a first face of the device wafer. The first mask patterns at least lateral dimensions of comb structures and outlines of large device structures. First trenches are etched using the first mask, the first trenches defining the lateral dimensions of the at least comb structures and outlines of large device structures in a single deep etching process, the first trenches having a first depth. The first trenches are filled with a deposit layer, and at least a first recession mask is patterned on the first face of the device wafer, the first recession mask defining at least first areas of the device wafer where the surface of the device wafer is to be recessed below a first surface of the device wafer. At least first recession trenches are etched on the first areas, using the first recession mask, the first recession trenches having a first recession depth. At least a second recession mask is patterned on a second face of the device wafer, the second recession mask defining at least second areas of the device wafer where the surface of the device wafer is to be recessed below a second surface of the device wafer. At least second recession trenches are etched on the second areas, using the second recession mask, the second recession trenches having a second recession depth. The deposit layer added previously is removed to release the movable parts of the micromechanical device layer.

According to a second aspect, a method for manufacturing micromechanical structures is provided, wherein before the first recession trenches are etched, a first intermediate mask is patterned on top of the first recession mask on the first face of the device wafer. The first intermediate mask defines third areas of the device wafer where the device wafer is to be recessed to a third recession depth. The third recession depth is greater than the first recession depth. Third recession trenches are etched on the third areas, using the first intermediate mask, to a first intermediate depth that is less than the third recession depth. The third recession trenches are further etched using the first recession mask simultaneously with etching the first recession trenches to the first recession depth, in order to increase the depth of the third recession trenches to a depth equal the third recession depth, or before the etching of the second recession trenches, a second intermediate mask is patterned on top of the second recession mask on the second face of the device wafer, the second intermediate mask defining fourth areas of the device wafer where the device wafer is to be recessed to a fourth recession depth. The fourth recession depth is greater than the second recession depth. Fourth recession trenches are etched on the fourth areas, using the second intermediate mask, to a second intermediate depth that is less than the fourth recession depth. The fourth recession trenches are further etched using the second recession mask simultaneously with etching the second recession trenches to the second recession depth, in order to increase the depth of the fourth recession trenches to equal the fourth recession depth.

According to a third aspect, at least some of the first recession trenches and the second recession trenches are laterally limited by the first trenches filled with the deposit layer.

According to a fourth aspect, at least some of the third recession trenches and the fourth recession trenches are laterally limited by the first trenches filled with the deposit layer.

According to a fifth aspect, the method further comprises: after the patterning of the first recession mask, reducing thickness of the device wafer into a thickness corresponding to the intended final thickness of the micromechanical device layer.

According to a sixth aspect, the method further comprises, before reducing the thickness of the device wafer, turning the device wafer upside down, and attaching the device wafer to a handle wafer by fusion bonding.

According to a seventh aspect, the first depth is equal to or greater than the intended final thickness of the micromechanical device layer, the first recession depth is equal to the intended amount of recess of the structural elements of the micromechanical device layer that are to be recessed below the first surface of the micromechanical device layer, and the second recession depth is equal to the intended amount of recess of the structural elements of the micromechanical device layer that are to be recessed below the second surface of the micromechanical device layer.

According to an eighth aspect, the third recession depth or the fourth recession depth is less than the intended final thickness of the micromechanical device layer, and less than the thickness of the device layer material on the third areas or the fourth areas before the step of etching of the third areas or the fourth areas respectively, or device wafer material at the third areas of the device wafer is fully removed by etching the third recession trenches through the structure in the first recession trench etching step, or device layer material at the fourth areas is fully removed by etching the fourth recession trenches through the structure in the second recession trench etching step.

According to a ninth aspect, the patterning is performed using one of a photoresist and a silicon dioxide layer as mask material and using photolithography as a mask patterning method.

According to a tenth aspect, the first and second intermediate masks are of different material than the first and second recession mask respectively.

According to an eleventh aspect, the step of first trench etching comprises use of an anisotropic etching process, and the steps of recession trench etching comprise use of at least one of an anisotropic etching process and an isotropic etching process.

According to a twelfth aspect, the first etching results in first trenches that have a width between 1 µm and 8 µm, the width of the first trenches defining lateral separations between the comb fingers and movable structures.

According to a thirteenth aspect, the filling the first trenches defining the comb structures and outlines of larger device structures with a deposit layer results in an essentially planar surface on the first face of the device wafer for subsequent patterning steps to be performed on the first surface.

According to a fourteenth aspect, the reducing the thickness of the device wafer into a thickness corresponding to the intended final thickness of the micromechanical device layer comprises at least one step of grinding or polishing or partial etching, or the reducing the thickness of the device wafer results in an essentially planar second surface of the device layer for subsequent patterning to be performed on the second surface.

According to a fifteenth aspect, the first trenches further define the lateral outlines of any functional elements to be created from the device wafer, the functional elements including movable elements or suspension structures.

According to a sixteenth aspect, the functional elements comprise any of movable masses, springs, combs, limiters, bars, levers and suspension structures.

BRIEF DESCRIPTION OF THE DRAWINGS

In the following the invention will be described in greater detail, in connection with preferred embodiments, with reference to the attached drawings, in which.

DETAILED DESCRIPTION

Figure 1A:
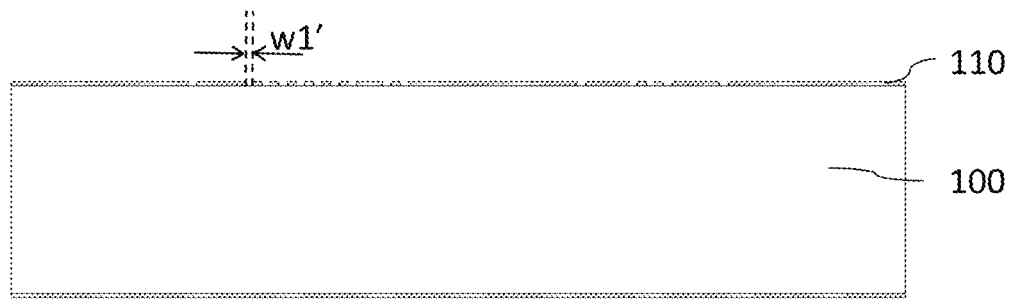
FIGS. 1a to 1h illustrate steps of a first exemplary manufacturing process.

"Device wafer" refers to a homogenous semiconductor material wafer, such as a silicon wafer that is used for creating the movable parts of a MEMS device.

"Device layer" refers to a part of the device wafer that forms the final functional layer of the MEMS device. Device layer manufactured using an etching process is typically thinner than the device wafer in its initial thickness, and it includes at least movable parts and supporting structures of the MEMS device. Device layer includes non-movable parts that extend to the whole thickness of the device layer, and movable parts that may be recessed below either surface of the device layer, thus having thickness that is less than the thickness of the device layer. One or more parts of the device layer may be intentionally made thinner, for instance by forming at least one shallow basin, with an essentially planar face within the recessed, bottom area of the basin, on at least one face of the device layer, the shallow basin being relatively large compared to the movable parts in the device layer. In such case, the planar face of the shallow basin may be considered as part of the (planar) face of the device layer, as a large, shallow depression has no significant effect for instance on accuracy of photolithography patterning.

"Handle wafer" refers to a semiconductor material wafer, such as a silicon wafer that is used as a rigid underlay layer on which the device layer is attached and supported to. Handle wafer may be covered with protective layer such as a silicon dioxide layer. Handle wafer may be processed to include for example recessed areas for allowing room for movement for the device layer movable structures.

A wafer, such as the device wafer or the handle wafer is patterned and etched in order to define the structural parts of a micromechanical device in its semiconductor layer. Masking is needed for the etching so that the etching affects only specific areas of the device wafer and the masking blocks regions where etching is not desired. The masking may be performed by patterning a deposited masking material or by depositing a patterned masking material on the wafer.

For patterning a deposited masking material, e.g. the known process of photolithography (a.k.a. optical lithography) may be used. Photolithography involves use of a photoresist material as a mask in order to generate the specific pattern on the surface of the wafer, for example for defining the shape of micro-machined structures on the wafer.

Photoresist is a light sensitive material that can be processed into a specific pattern by exposing it to light energy in the shape of the desired pattern. Patterning of a photoresist may take place by exposing the photoresist material to ultraviolet (UV) light. Once the photoresist has been patterned, the wafer will be covered by the photoresist only in specific areas while the remainder of the wafer is uncovered. Photolithography is useful because it can transfer the pattern to the wafer surface very quickly. Direct-write methods can also be used but are slower than photolithography.

Mask removal or mask stripping is implemented with any method suitable for the used masking material. In case of a photoresist, a liquid "resist stripper" may be used, which chemically alters the photoresist material so that it no longer adheres to the substrate wafer. Alternatively, the photoresist mask may be removed by plasma containing oxygen, which oxidizes the mask material. This process is called plasma ashing, and it resembles dry etching.

FIGS. 1a to 1h illustrate steps of a first exemplary manufacturing process that are performed on the first face of the device wafer (100).

The term "lateral" refers to the projection of the structures in the xy-plane, i.e. in a horizontal plane formed by the planar device wafer (100). Term vertical refers to the z-axis direction, perpendicular to the xy-plane and to the plane of formed by the device wafer (100).

In the final MEMS product, the first face of the device wafer (100) that is here facing up, will form the bottom face of the device layer, facing towards a rigid substrate layer below the device layer formed from a handle wafer.

In FIG. 1a, there is a cross section of a device wafer (100) covered with a protective oxide layer where a first mask (110) has been patterned on. Thus, the protective oxide layer is used as photoresist material for the first masking. In a typical silicon wafer process this oxide layer is a silicon oxide ($SiO_2$) layer. The device wafer (100) is of homogenous wafer material that will become the functional device layer of a MEMS device. Before patterning the first mask (110), the device wafer (100) and the surface of the protective oxide layer or other applicable masking material layer on top of the device wafer (100) is planar, enabling high precision photolithography to be utilized for creating a pattern on the first masking layer.

First mask (110) has been patterned on the first masking layer. Line width (w1) of the patterned first mask (110) defines lateral distances between structures to be etched in the material layer. The first mask (110) also defines outlines of larger structures. In this cross section, we may see the pattern of the first mask (110) as areas of the oxide layer, where the masking layer has been removed and the device wafer is exposed for subsequent etching. By using high precision photolithography for creating a high precision first mask (110), patterns may be formed that have typical line width (w1') of 2 µm. Based on design, the line width (w1') of the patterns may vary between 1 µm and 8 µm. It should be understand that a design may include lines with different width. By using a single high precision first mask (110), the lateral distances between all critical structures of the device layer, such as vertical combs can be defined with high accuracy.

Figure 1B:
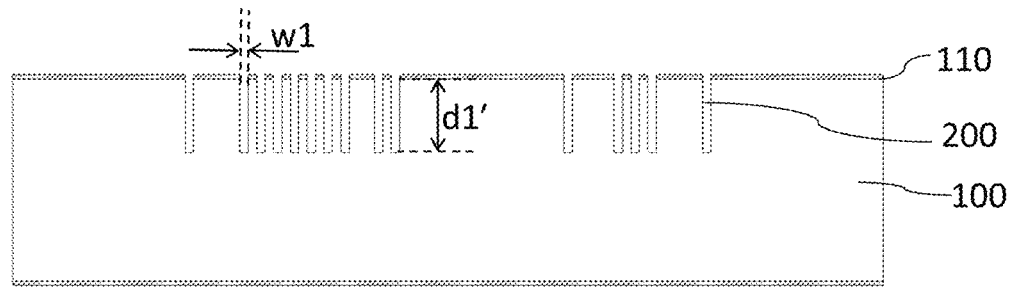

FIG. 1b describes the result after etching of first trenches (200) using the first mask (110) as shown in FIG. 1a. These first trenches (200) define the final lateral dimensions of the structures in the device layer. Width of the first trenches (w1) equals to the preset horizontal gap between all critical structures—also between any structures that will be created on different height within the device layer, or structures having different thickness. Due to undercutting and/or any other known non-idealities of the etching process, the line width (w1') of the first mask (110) may be slightly different from the intended lateral distances (w1) of the structures defined by the first trenches (200). Knowing the non-idealities of the etching process, which may vary over the area of the device wafer, the first mask (110) may however be designed so that the final width (w1) of the first trenches is sufficiently precise. Depth (d1') of the first trenches (200) shall be at least equal to the intended final thickness of the device layer (d1), but it may be more than the intended final thickness of the device layer. For example, the depth (d1') of the first trenches may be for instance between about 35 µm and 50 µm, but any other suitable depth may be chosen based on the device layer design and performance requirements.

In order to be able to create good quality vertical sidewalls, a method called Deep Reactive-Ion Etching (DRIE) is preferably used for the etching of the first trenches (200), since it is known to be a good method for producing vertical sidewalls for the trenches, so that the good precision of the used high precision first mask (110) may be maintained for the etched first trenches (200). DRIE is a special subclass of Reactive-Ion Etching (RIE). It is a highly anisotropic etch process usually used to create deep penetration, steep-sided holes and trenches in wafers/substrates. RIE "deepness", naturally depends on application. In MEMS, DRIE is typically used for anything from a few micrometers to 0.5 mm. In this process, etching depths of hundreds of micrometers are achieved with almost vertical sidewalls. Another technology called "Bosch process" is an alternative for DRIE etching. In the Bosch process, two different gas compositions alternate in the reactor.

As this etching is made on a planar bulk wafer, and there are no other factors or special restrictions for the etching step, the process may be easily optimized for controlling variation in the critical dimensions (i.e. lateral distances) and for tilt performance, resulting to precisely dimensioned outlines for all movable parts of the micromechanical device to be created on the device layer.

While all structures, recessed or non-recessed, may in this process be laterally defined with this single etching phase, all device layer structures become laterally self-aligned with each other with high precision, independent of the later steps taken for example for recessing different device layer structures from different faces of the device layer.

It can be noticed in FIG. 1b, that the first mask (110) material layer thickness has slightly decreased during the etching of the first trenches. This is a normal phenomenon in an etching process, and by having a sufficiently thick first mask layer, so that a layer of mask material remain in the first mask (110) throughout the first etching phase, this does not cause decrease in the accuracy of the etched pattern.

Figure 1C:
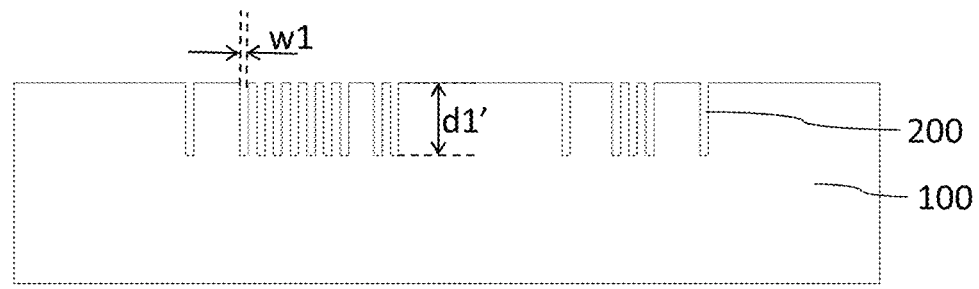

FIG. 1c presents the next step of the manufacturing process, where the original first masking layer is removed. There is now just the plain device wafer (100) with the etched first trenches (200). This mask removal may be implemented by suitable etching process as described earlier.

Figure 1D:
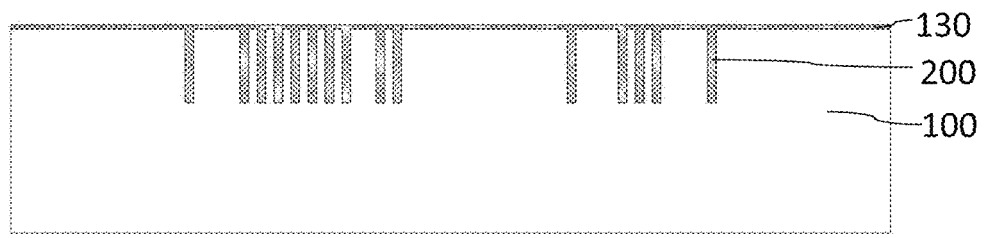

FIG. 1d presents a step of filling the first trenches (200) with deposit material. In this example, TEOS oxide (Tetraethyl OrthoSilicate) is used as a precursor for filling. TEOS is a chemical compound $Si(OC_2H_5)_4$ that has a remarkable property of easily converting into silicon dioxide $SiO_2$. As a result of the filling process, the first trenches (200) will be filled with silicon dioxide $SiO_2$. Also a silane may be used as a precursor to silicon dioxide and may be applied to substrates under dry aprotic conditions by CVD, which favors monolayer deposition. Silanes are saturated hydrosilicons, with the general formula SinH2n+2. The simplest silane is an inorganic compound with chemical formula $SiH_4$. Silane may also refer to many compounds containing silicon, such as trichlorosilane $(SiHCl_3)$ and tetramethylsilane $(Si(CH_3)_4)$. Under proper conditions, almost all silanes may be applied to substrates in vapor phase.

Use of TEOS oxide filling process creates a limiting factor for the available maximum width (w1) of the first trenches (200) that are filled. This is because it has been found, that TEOS oxide filling process can reliably fill gaps that are in range of 1 µm to 8 µm. A well performing trench width (w1) for the TEOS filling process has been found to be 2 µm, which also provides in practice a well suitable value for horizontal distance between movable parts of a MEMS device.

Because of the properties of the currently used TEOS filling process, the maximum line width (w1) for first trenches (200) generated as described in FIGS. 1a and 1b is in practice limited, while the first trenches (200) are to be filled in order to return the device wafer (100) into rigid structure with the filling step, and to enable having again a planar first face for subsequent processing step. This is not a problem, however, as by defining the outlines of bigger areas with the first mask and the first etching, also the bigger areas may be precisely defined. Excess material in any bigger areas will be removed during later etching steps. As technology advances, broader or narrower trenches may be allowed.

In order to enable precisely defining all structures of the device layer with etching of the first trenches (200) as shown in FIG. 1b, only the outlines of the large structures are etched during the etching of the first trenches (200), but the greater areas are left intact. This way next processing steps may be performed on a rigid substrate and essentially planar first surface of the device wafer (100) for further processing after the first trenches have been filled.

During filling of the first trenches (200), a thin silicon dioxide $SiO_2$ layer (130) builds on top of the device wafer (100).

Figure 1E:
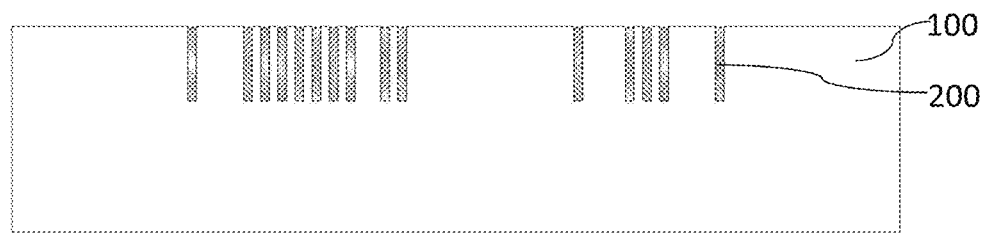

FIG. 1e presents the device wafer (100) after the thin silicon oxide layer (130) built on the first face of the device wafer (100) during filling the first trenches (200) has been removed from the first face of the device wafer (100). This removal may be implemented for example by etching as described earlier. Although some slight decay of the filling material at the top of the first trenches (200) may occur during this thin silicon dioxide layer etching step, the device wafer (100) still forms a rigid substrate for subsequent processing, and the first face of the device wafer (100), on which the pattern formed by the filled first trenches (200) is exposed, can still be considered essentially planar.

Figure 1F:
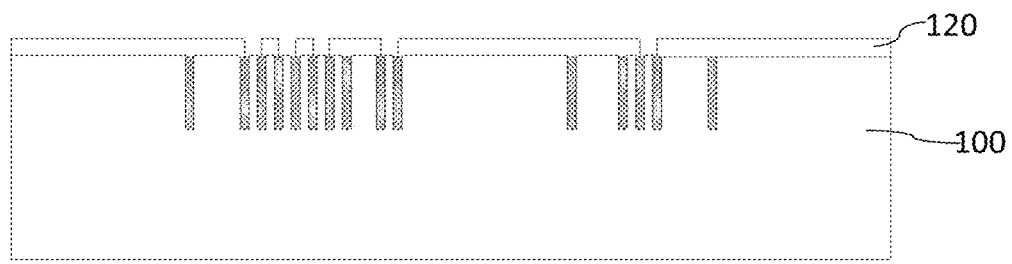

FIG. 1f presents step of the manufacturing process, where a first recession mask (120) is patterned on the first face of the device wafer (100). This patterning may be implemented in various ways as described above. This first recession mask (120) defines areas of the device wafer (100) that correspond to device structures whose surface at the first side of the device wafer (100) shall be recessed below the first surface of the device wafer (100). These structures will also be recessed below the first surface of the device layer. The precision requirement for alignment of this first recession mask (120) is defined by the minimum line width (w1) of the first trenches (200). An alignment within for example the exemplary 2 μm that was used in the exemplary design is well achievable with modern methods. The second mask may comprise a photoresist layer.

Figure 1G:
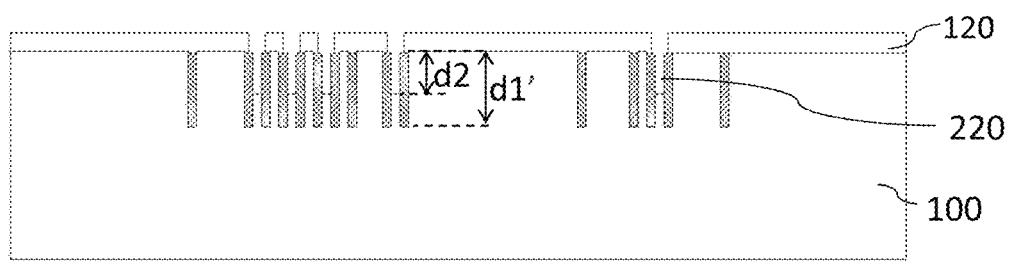

FIG. 1g presents the device wafer (100) after a first recession etching step. Now the device wafer areas that were left exposed to etching, i.e. that were not covered with the first recession mask resist layer (120), have been etched to a first recession depth (d2), forming first recession trenches (220). This etching may be done using an anisotropic etching method such as for example DRIE etching. Alternatively, a recession trench etching may be performed using an isotropic etching method, since the etching process is vertically limited with the silicon dioxide filled first trenches (200). This first recession depth (d2) is less than the first depth (d1') of the silicon dioxide filled first trenches (200), so that the created first recession trenches (220) are shallower than the first trenches (200). In example, the first recession depth (d2) may be 20 μm. The second depth equals to the intended recession of the etched device structures below the first face of the device wafer (100), which will also be the first face of the final device layer. The filling in the first trenches (200) remains essentially intact during this first recession etching step. Although in FIG. 1g all first recession trenches (220) have been etched between the areas defined by the first trenches (200), it's also possible to etch further first recession trenches (220) in other locations. However, the alignment of such further first recession trenches (220) will depend on the alignment of the second mask (120) and may thus be less accurate than the alignment of structures defined by the first trenches (200).

Figure 1H:
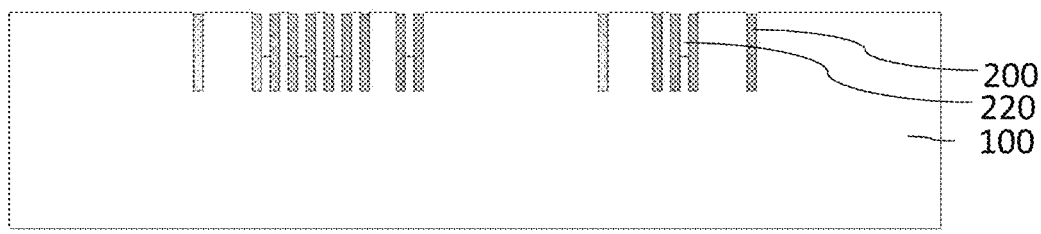

FIG. 1h presents the final step performed on the first face of the device wafer (100), namely removing second mask layer (120), thus exposing the device wafer (100) at the first face of the device wafer (100) for further processing.

The manufacturing process now continues by flipping the device wafer (100) so that the second face of the device wafer is on top. This is shown in FIG. 2a. The structure of the device wafer (100) has not changed between FIGS. 1h and 2a, just the orientation.

FIGS. 2b and 2c describe next phase of the first exemplary manufacturing process where the device wafer (100) is attached to a handle wafer (300). This attaching may be implemented in example by fusion bonding. Handle wafer (300) has been prepared by etching relatively large but shallow cavities (350) in the handle wafer, the cavities (350) providing room for the movable parts of the device wafer to move vertically as intended. The handle wafer (300) also has suspension structures (355) where the device wafer (100) will be attached to, suspending the respective attached parts of the device wafer (100) to a fixed position. There is a silicon dioxide layer (310) on the face of the handle wafer (300) that for example facilitates the fusion bonding process. The areas of the device wafer (100) with movable elements are aligned with the cavities (350) in the handle wafer (300). The accuracy requirement for the alignment of the device wafer (100) and the handle wafer (300) may be for example 5 μm, in order to ensure that the suspension structures (355) and the cavities (350) in the handle wafer (300) may fulfill their intended functions.

FIG. 2d describes an optional, additional phase of the manufacturing process. This option may be used when at least one electrical plug or via is to be created through the device layer, allowing coupling the handle wafer (300) to a specific electrical potential. If such plugs are to be created, the device wafer (100) may be first grinded to a thickness (d1+da) that is more (da) than the final target depth (d1) of the device layer, and also more than the depth (d1') of the first trenches (200). The difference (da) may be, for instance, about 10 μm.

FIG. 2e shows the result of the optional, additional plug creation process. A plug (170) has been created, going through the entire device wafer (100) layer, and also through the silicon oxide layer (310) between the device wafer (100) and the handle wafer (300). Creation of a plug (170) in a layered silicon structure is known by a person skilled in the art, and while the steps for creating such plug does not form a necessary or an integral part of the claimed invention, detailed description is omitted. The plug may be made for instance of metal or doped polysilicon having application specific conductivity properties.

Figure 2F:
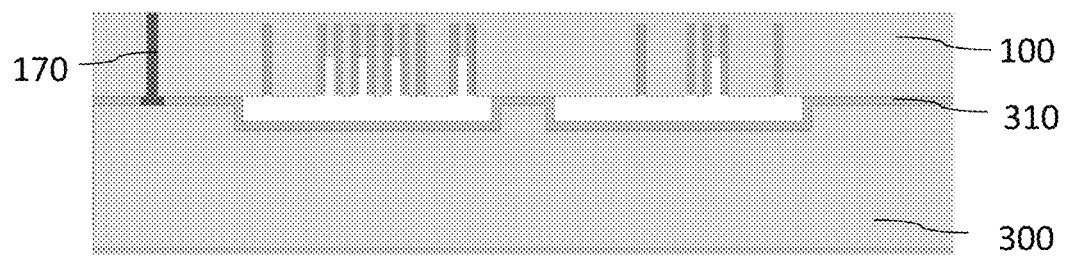
FIGS. 2a to 2p illustrate further steps of the first exemplary manufacturing process.
Figure 2F:
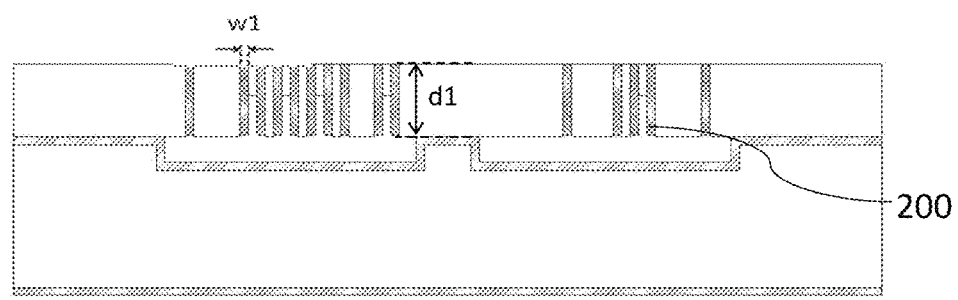
Figure 2G:
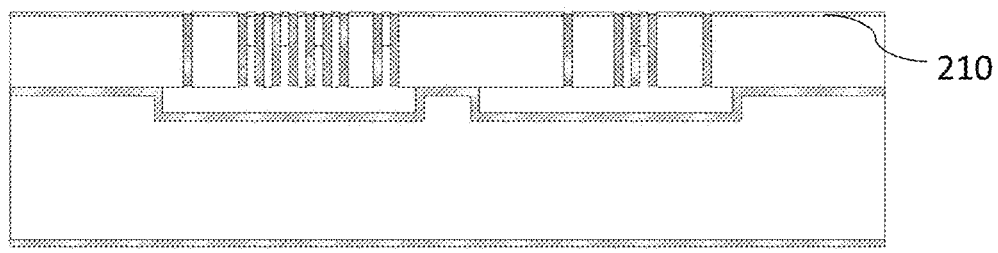

FIG. 2f presents a step where the thickness of the device wafer is reduced into a thickness corresponding to the intended final thickness of the micromechanical device layer (d1), which is less than or equal to the minimum depth (d1') of the first trenches (200). This reducing of thickness may be implemented in one phase after phase 2c, for example when no intermediate steps are needed for creation of plugs. The reducing step may comprise multiple processing methods, such as grinding and polishing. Reducing the device wafer may also comprise partial etching. If a plug (170) was created, more than one phases of reducing the thickness may be needed. In the first additional embodiment presented in FIGS. 2d and 2e, where at least one plug (170) is included in the micromechanical device design the remaining excess thickness (da) of the device wafer (100) that was intentionally left intact in phase 2d, is now grinded and/or polished away so that the thickness of the device wafer (100) now equals to the final target thickness of the device layer (d1). For example, the thickness (d1) of the device wafer (100) may now be 40 μm, but any other thickness may be selected based on the design of the micromechanical device and the device layer thereof.

Now the second face of the device wafer (100) is revealed for processing. After the polishing, the filled first trenches (200) are revealed at the second face of the device wafer (100) so that the laterally self-aligned outlines appear in the planar second face of the device wafer (100). Now the device wafer (100) may be prepared for etching from the second face. Similarly to patterning first and second mask on the first face, the planar second face allows rather precise patterning of a mask on the second face. However, the alignment of the mask patterning does not have to be extremely precise, as all critical alignments of the lateral dimensions of the device structures have already been defined by the filled first trenches (200). The width (w1) of the filled first trenches (200) sets the requirement for the accuracy of the alignment of the subsequent mask patterning step(s) on the second face of the device wafer (100). It should be noted, that although we discuss hereafter about the second face of the device wafer (100), this is not the original second face of the device wafer (100) but a face of the wafer on the second side (opposite to the first face) that has been created through the grinding and polishing step 2f or through series of grinding and polishing steps 2d to 2f.

In step 2g, a new silicon dioxide $SiO_2$ layer (210) is generated on the second face of the device wafer (100). One possible deposition method is thermal oxidation, in which case the thermal $SiO_2$ mask layer is built up on the exposed silicon areas only leaving the filled first trenches (200) areas open, thus proving surface contrast for the following lithography alignment procedure. This silicon dioxide layer (210) on the second face of the device wafer (100) will be patterned to form a second recession mask (210a), using photoresist patterning.

In the current example, a double layer mask will be created. In this first exemplary manufacturing process, a double mask etching process will be used on the second face of the device wafer (100) for the subsequent etching steps performed on the second face of the device wafer (100) in order to allow etching patterns that are recessed to different depths below the second face of the device wafer (100) and even removing the device wafer in some areas altogether. With double mask etching process we refer to a process where at least two different masking layers are used one after another at same face of the device wafer (100) that are used to perform etching in two different phases in order to generate structures with different amount of recession from the same face of the device wafer (100). Double mask etching process includes at least one intermediate etching step (in current example, etching between phases illustrated in FIGS. 2k to 2l) and a final recession etching step (in current example, etching between phases illustrated in FIGS. 2m to 2n), wherein the intermediate etching step(s) is/are used on a subset of areas that are etched during the final recession etching step. An intermediate mask layer covers some areas that will be etched in the final recession etching step, but leaves a subset of areas exposed by the "lower" mask exposed to the intermediate etching, i.e. the mask located closer to the device wafer (100) on the same face of the device wafer as the respective intermediate mask. In this exemplary process, one intermediate etching step is used in the double mask etching process, thus giving the name to this method, but the same principle may be utilized with even more intermediate mask layers and intermediate etching steps without departing from the scope. If more than one intermediate etching steps would be used, it's likely that at least one intermediate mask is patterned on a non-planar surface having already some recessed areas, thus possibly causing some increased inaccuracy for the additional intermediate masks.

We will next describe a double mask etching process where two different depths of recessing are used; a second recession depth (d3) and a fourth recession depth (d5) below the surface of the second face of the device wafer (100). In the current example, the fourth recession depth (d5) equals to the entire thickness of the device wafer (100) after reducing the thickness of the device wafer (100) as in step 2f, so that the thickness of the device wafer (100) equals to the target thickness of the device layer (d1), which means that in locations that are etched to the fourth recession depth (d5) the device wafer material will be entirely removed. The recess defined by the second recession depth (d3) is less than the thickness of the device layer (d1). For example, the second recession depth (d3) may equal 15 μm, and the fourth recession depth (d5) may be 50 μm.

In another design, it may be that there is no need to create such double layer mask for different etching depths from the second face of the device wafer (100), but a single etching step would be sufficient for generating the needed recessed areas for the second face of the device wafer (100). In such case the second face could be patterned using steps 2g, 2h, 2i, 2j and 2n, omitting any intermediate steps described below.

Figure 2H:
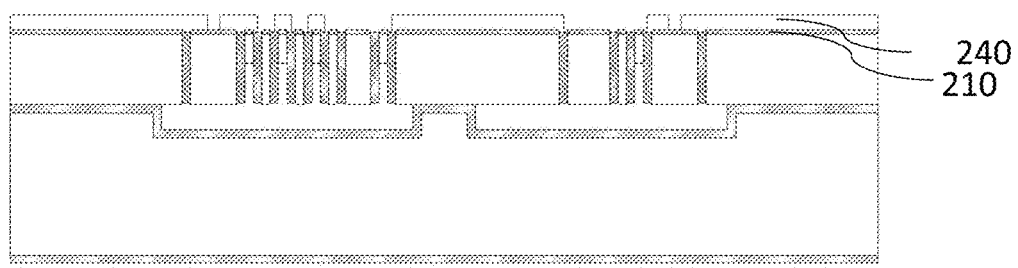

In FIG. 2h, a second photoresist mask (240) is patterned on the second face of the device wafer (100). This second photoresist mask (240) may be made of a first photoresist layer created and patterned by photolithography. The second photoresist mask (240) initially defines all areas of the device wafer that correspond to device structures whose surface at the second side of the device wafer (100) shall be recessed below the second surface of the device layer (i.e. recession depths d3 and d5), but it's not directly used for etching either of these. Instead, the second photoresist mask (240) is used for generating a first recession mask on the silicon dioxide layer (310), which will later be used for etching the pattern(s). In this phase, the silicon dioxide layer (210) on the second face of the device wafer (100) is still intact, and it's exposed in the open areas of the fourth mask (240) pattern.

The precision of alignment of this second photoresist mask (240) is defined by the minimum line width (w1) of the first trenches (200). An alignment within for example the exemplary 2 μm that was used in the exemplary design is well achievable with modern methods.

Figure 2I:
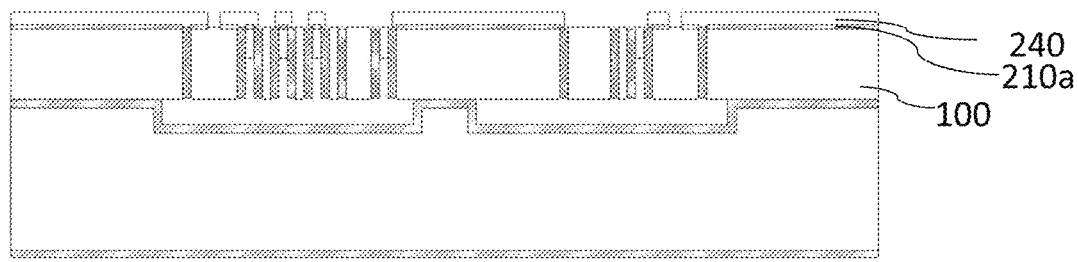

In step presented in FIG. 2i, the silicon dioxide layer (210) is partially removed, in other words removed from the areas where the silicon dioxide layer (210) is exposed to etching, for example in the areas where the mask created with the second photoresist mask layer (240) has holes exposing the silicon dioxide layer (210) to etching. These areas of exposed silicon dioxide layer (210) may be removed for example by dry etching. The silicon dioxide layer (210) now forms the intended second recession mask (210a) that will subsequently be used for etching the recession trenches that may have different recession depths (d3, d5). Now the device wafer silicon in areas which will be recessed below the second face of the device wafer (100) is visible and exposed to further processing.

Figure 2J:
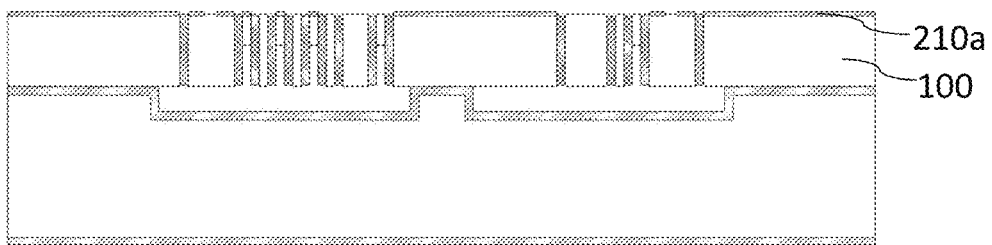

In step described in FIG. 2j, the second photoresist mask (240) used for patterning the second recession mask (210a) is stripped away, leaving the second recession mask pattern (210a) of device wafer silicon exposed. This stripping may be implemented using any method suitable for removing the used mask material as described earlier and/or known by a person skilled in the art.

Figure 2K:
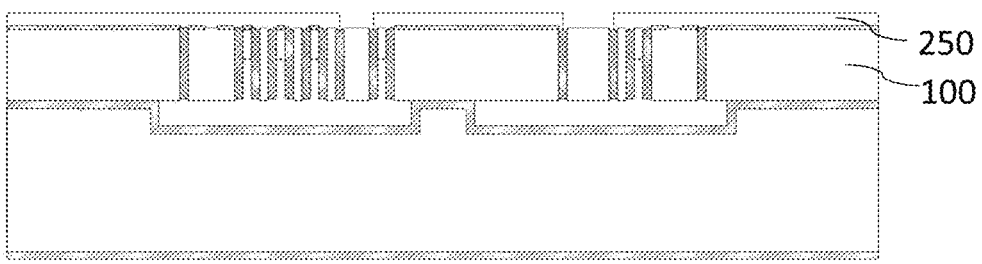

In FIG. 2k, a second intermediate mask (250) of photoresist material is patterned on top of the second recession mask (210a) on the second face of the device wafer (100). This second intermediate mask (250) defines areas where device wafer (100) material will be etched into the fourth recession depth (d5) below the second face of the device wafer (100). It can be noticed that the areas that are exposed to etching by the second intermediate mask (250) are a subset of the areas exposed by the second recession mask (210a). In this example this fourth recession depth (d5) equals to the entire depth of the device layer (d1) so that any remaining device wafer material after reducing the thickness of the device wafer (100) to equal the thickness of the device layer (d1) in these areas will be entirely removed by etching. Typically these may be some larger areas. The outlines of the areas to be removed are defined by the first trenches (200) so that the location of these areas is also very precisely aligned with all remaining structures in the device layer. Alignment accuracy of the second intermediate mask (250) is similar to any other masks, defined by the minimum line width (w1) of the first trenches (200). An alignment within for example the exemplary 2 μm that was used in the exemplary design is well achievable with modern methods.

Figure 2L:
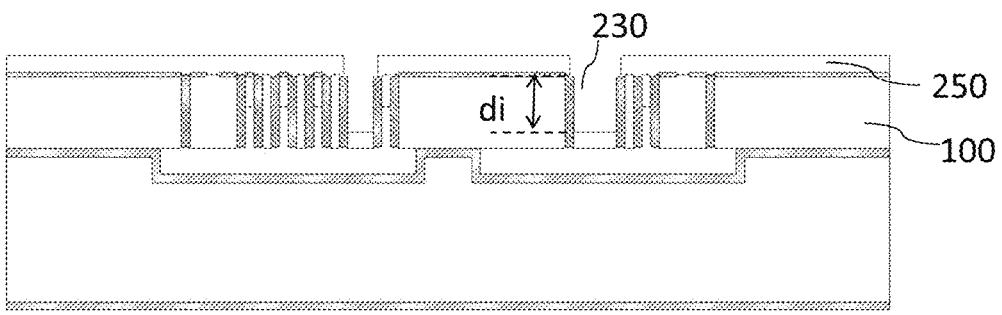

In FIG. 2l, an intermediate etching step is performed, where the areas (230) where the material of the device wafer are etched to a first intermediate depth (di) that will later be further etched to a greater depth, such as the fourth recession depth (d5). In this exemplary embodiment, the material in these areas (230) that are first etched to an intermediate depth (di) will later be entirely removed by etching in subsequent etching phase. In other words, the fourth recession depth (d5) equals to the depth of the device layer (d1). These areas (230) are first etched to a defined intermediate depth (di), which is less than the current thickness of the device wafer (d1). In the exemplary design, where the final device layer thickness is 50 μm, this intermediate depth (di) may equal 40 μm. The used intermediate depth (di) may be optimized for accuracy of the masking process. The deeper the intermediate etching step is, the thicker the second intermediate mask (250) must be, since the mask layer is also affected by the etching process. Although the mask can be made thicker, the accuracy of the mask will reduce with the thickness of the mask photoresist material layer. Thus, the mask layer thickness is adjusted to balance between requirement for accuracy of alignment and allowed depth of etching with the used mask.

Figure 2M:
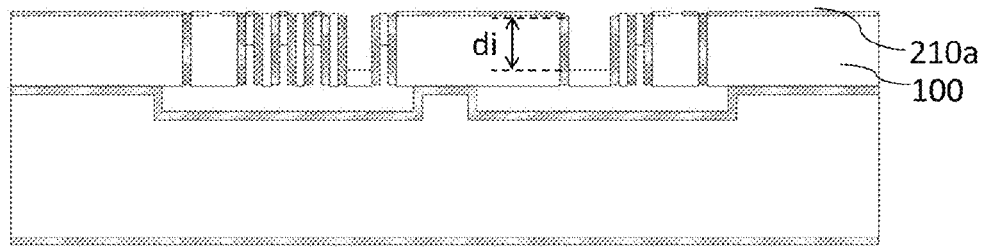

FIG. 2m illustrates the phase after the second intermediate mask (250) has been removed, exposing the patterned second recession mask (210a) that was created in step described in connection to FIG. 2j. The removal of the second intermediate mask (250) may be implemented by any method known by a person skilled in the art, as described above.

Figure 2N:
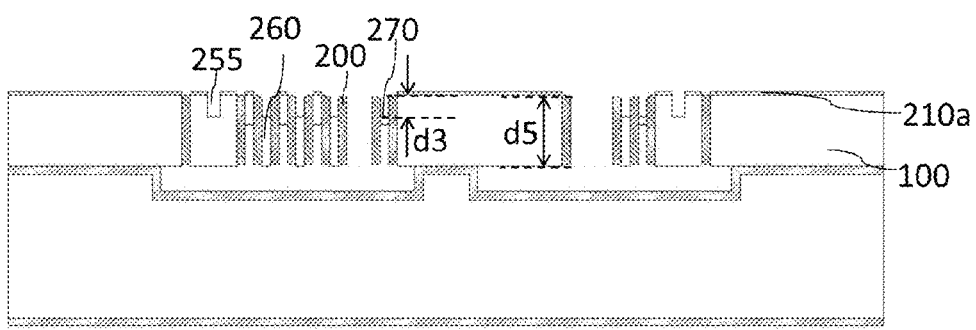

FIG. 2n describes a second recession etching step, creating at least second recession trenches. In this step, the second recession mask (210a) formed by the silicon oxide layer (210) is used as the pattern for etching. This etching phase is preferably performed using a dry etching method such as DRIE etching. In this step, the areas of the device wafer (100) that correspond to device structures whose surface at the second side of the device wafer, called as second recession trenches, are recessed to a second recession depth (d3) below the second face of the device wafer (100). At the same time with etching the second recession trenches, the areas of the fourth recession trenches where device wafer material is to be recessed to the fourth defined recession depth (d5) below the second face of the device wafer (100) are finally etched to their final depth. This is because the second recession mask (210a) exposes both the areas for the second recession trenches and the already created fourth recession trenches etched into the defined intermediate depth (di) during the intermediate etching step. In the current example, this means that these areas are etched through the device wafer (100), so that the device wafer (100) material is removed.

Examples of structural parts that may be recessed by the second recession depth (d3) below the second face of the device wafer are for example combs or fingers of combs (260) and springs (270). Springs, for example spring (270) may even be recessed below both the first face and the second face of the device wafer (100) so that they will be recessed below both the first surface and the second surface of the final device layer. Such two side recessed spring may have a low spring constant, in other words, it may be characterized as a relatively loose spring. Also movable masses may be patterned with grooves (255) having second recession depth (d3) for various purposes during this third etching step. For example, grooves (255) may be created in a movable mass in order to make the movable mass lighter, or grooves (255) may be used to compensate non-ideal movements of a movable mass caused by structural inaccuracies due to non-ideal characteristics of the manufacturing process.

Figure 2O:
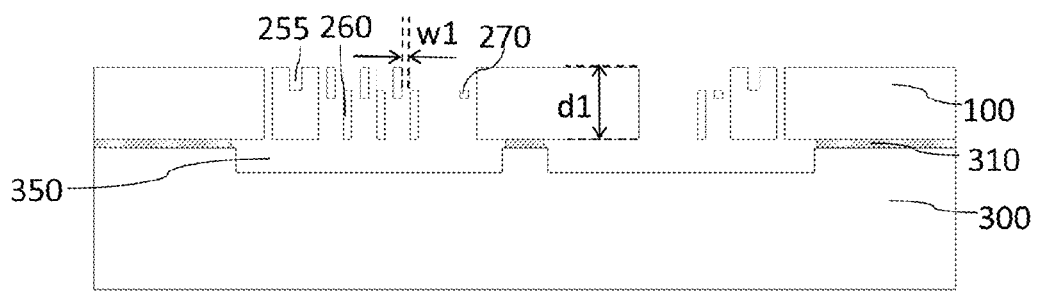

After the second recession etching step described in FIG. 2n, the silicon dioxide layer forming the second recession mask (210a) may be removed in step 2o, together with removing silicon dioxide deposit material from the first trenches (200) and with removing silicon dioxide coating from any further uncovered surfaces of the micromechanical device structure, such as the silicon dioxide coating on the faces of the cavity (350) of the handle wafer (300). By using a vapor or wet etching technique, such as Hydrofluoride (HF) acid vapor or wet HF process, the oxide may be removed even from under the device wafer. The result of this phase is presented in FIG. 2o. All movable parts of the micromechanical device, recessed or not, are now capable of moving as intended and made of homogenous wafer material that was originally the single homogenous device wafer (100), and while all vertical edges of the movable parts were defined by the etching of the first trenches (200), the surface structure of vertical faces of different movable elements is alike, as these surfaces have been created in the same etching step, which similarity further enhances the uniformity and linearity of the electrical effects occurring in the electrical fields between the movable elements such as comb electrodes.

Figure 2P:
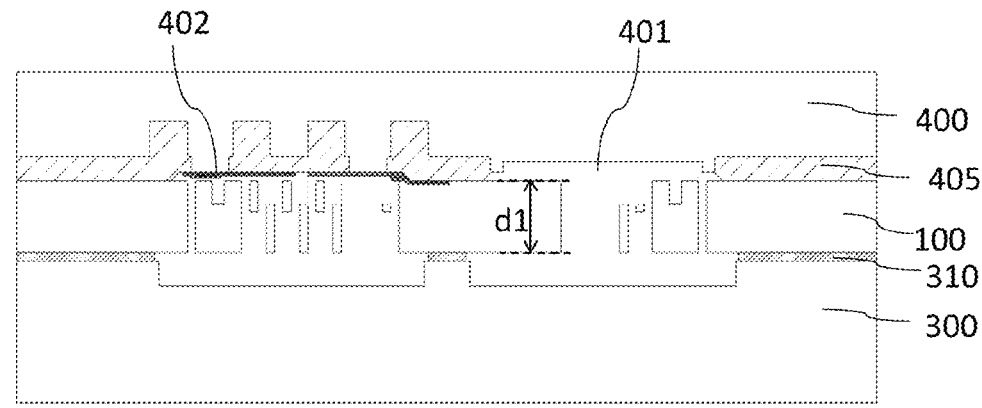

FIG. 2p describes the final step of the first exemplary micromechanical device manufacturing process, where a protective cap wafer (400) is placed on top of the device wafer (100) in order to seal the movable elements of the device wafer (100) from outside world. The cap wafer (400) structure may include cavities (401) in order to provide the movable elements the necessary room to move. Further, the cap wafer (400) may comprise cap electrodes (402) which may be for instance metal electrodes. Cap electrodes (402) may be used for micromechanical element driving and detection purposes, for example. Sealing material (405) such as glass may be used for attaching the cap wafer (400) with the device wafer (100).

In a second exemplary embodiment, utilizing the same principles as the first exemplary manufacturing process as described in relation to FIGS. 1a to 1h and 2a to 2p, but the process is further developed in order to manufacture a micromechanical device with multi-level comb structures. Now, a double mask etching process is used on both faces of the device process, so that different depths of recession may be defined on both faces of the device layer. Majority of the manufacturing steps performed in the second exemplary embodiment are similar to the first exemplary embodiment. Thus, parts of the second exemplary manufacturing process will be described simply by referring to the process described in connection to the first exemplary manufacturing process.

The second exemplary manufacturing process starts with defining the lateral distances between the structures and outlines of larger structures with a first mask (110) as illustrated in FIG. 1a.

Figure 3A:
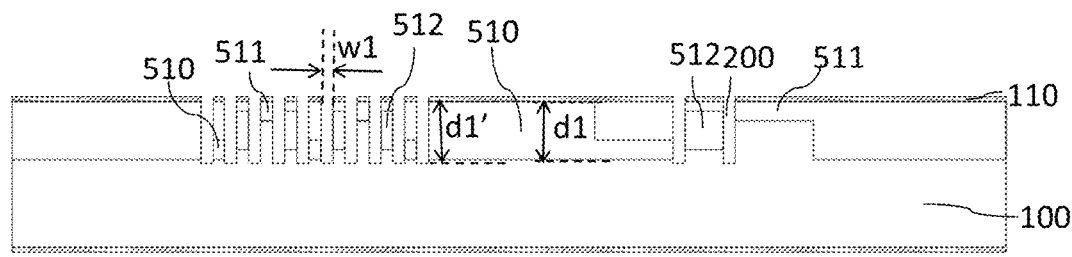
FIGS. 3a to 3i illustrate steps of a second exemplary manufacturing process for a first alternative embodiment.

FIG. 3a corresponds to the manufacturing process phase presented in FIG. 1b. The first trenches (200) are etched using the first mask (110) patterned similarly as was described in connection to FIG. 1b. These first trenches (200) define the final lateral dimensions of the structures in the device layer. The device wafer (100) is a solid, homogenous silicon based wafer, covered with the first mask (110). The first trenches have a depth (d1') that is equal to or more than the target thickness of the device layer (d1).

Lines have been used within the volume of the still unprocessed device wafer (100) to illustrate the target structures in the second exemplary manufacturing process, including multi-level comb structures. It should be understood that while these areas correspond to cross-sections of the planned result structure of the entire manufacturing process, these structures are in practice non-existing in the device wafer (100) until the process has been executed. Only the vertical edges of the structures have been outlined by the first trenches (200). A number of first stators (510), second stators (511) and rotors (512) will be formed during the following manufacturing steps. It should be understood that although shown in this illustration, these structures have only been outlined in lateral dimension by the first trenches (200) and they consist of the original, homogenous device wafer (100) material, and these target structures will be formed phase by phase during the second exemplary manufacturing process.

Next step in the second exemplary manufacturing process corresponds to the one presented in FIG. 1c, where the original first masking layer is removed, and the first trenches (200) are then filled with deposit material according to FIG. 1d.

In order to create structures having varying recess from the first face of the device wafer (100), a double mask etching process is performed with steps illustrated with FIGS. 3b to 3i at the first face of the device wafer (100), before flipping the device wafer (100) upside down and performing further manufacturing steps on the second face.

Figure 3B:
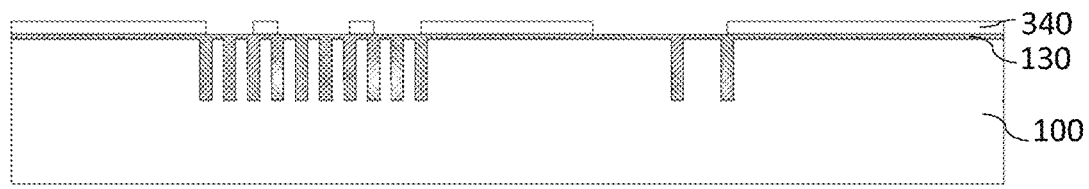

FIG. 3b presents next step in the second exemplary manufacturing process. In this figure, illustration of the target structures have been excluded in the drawing for clarity. A first photoresist mask (340) of photoresist material is patterned on top of the thin silicon oxide layer (130) built on the first face of the device wafer (100). This patterning may be implemented in various ways as described above. This first photoresist mask (340) defines areas of the device wafer (100) that correspond to device structures whose surface at the first side of the device wafer (100) shall be recessed to any depth below the first surface of the device wafer (100). These structures will also be recessed below the first surface of the device layer. The precision requirement for alignment of the first photoresist mask (340) is defined by the minimum line width (w1) of the first trenches (200). An alignment within the exemplary 2 μm that was used in the exemplary design is well achievable with modern methods. The first photoresist mask (340), however is used for patterning the thin silicon oxide layer (130), which will later be used as the actual recession etching mask for the patterns defined by the first photoresist mask (340). It may be noticed, that this step resembles with step 2h, except that now the first photoresist mask (340) is patterned on the first face of the device wafer (100) and on top of the silicon dioxide layer generated during the TEOS filling process, thus patterning areas that will be recessed below the first face of the device wafer (100).

Figure 3C:
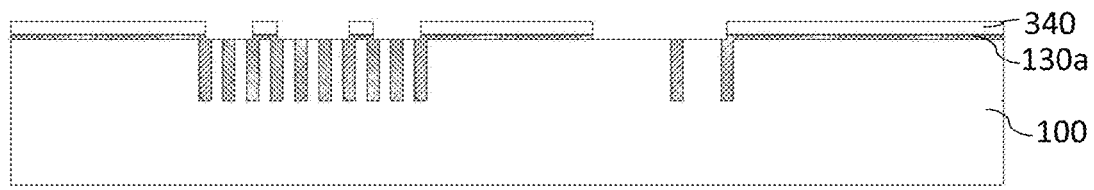

FIG. 3c illustrates a next phase, where the thin silicon dioxide layer (130) built on the first face of the device wafer (100) during filling the first trenches (200) is patterned by removing material from the silicon dioxide layer on the first face of the device wafer (100) in the areas exposed by the first photoresist mask (340). This removal may be implemented for example by etching as described earlier. It may be noticed that this phase resembles phase 2i in the first exemplary manufacturing process, except that now the silicon oxide layer (130) built during the deposit layer creation in phase corresponding to FIG. 1d is partially removed from the first face of the device wafer (100) instead.

Figure 3D:
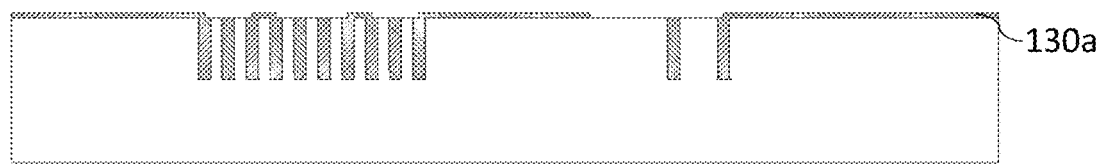

In FIG. 3d, the first photoresist mask (340) is removed, exposing a patterned first recession mask (130a) that was created in step described in connection to FIG. 3c. The removal of the first photoresist mask (340) may be implemented by any method known by a person skilled in the art, as described above. It may be noticed that this phase resembles phase 2j, except that the first photoresist mask (340) is removed from the first face of the device wafer (100). On the other hand, used term first recession mask (130a) links this mask layer to the first recession mask (120) of the first exemplary embodiment, as both these masks are used for defining areas to be recessed on the first face of the device wafer (100) with a single etching phase. The purpose of these first recession masks (120, 130a) is thus common, although they may consist of different material.

Figure 3E:
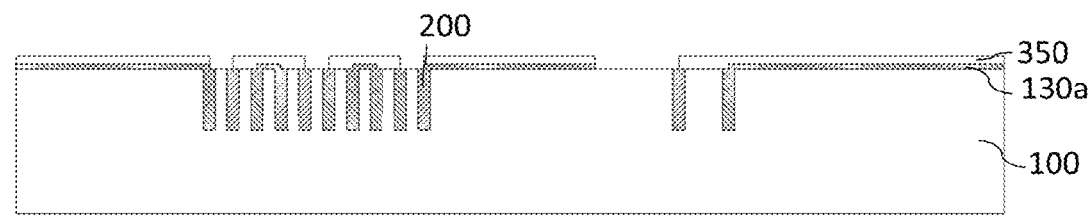

FIG. 3e presents next step in the second exemplary manufacturing process. A first intermediate mask (350), comprising photoresist material in this example, is patterned on top of the first recession mask (130a) on the first face of the device wafer (100). This patterning may be implemented in various ways as described above. A requirement for the material of the first intermediate mask (350) is that should be removable with a method that does not significantly affect the first recession mask (130a). This first intermediate mask (350) defines areas of the device wafer (100), which may be called as the third recession trenches, that correspond to device structures whose surface at the first side of the device wafer (100) shall be recessed relatively much below the first surface of the device wafer (100). These structures will also be recessed below the first surface of the device layer. For example, such structures may include recessed areas of first stators (510). The first intermediate mask (350) also covers selected parts of the first face of the device layer (100) exposed by the second mask (130a). These areas correspond to the areas that will be recessed below the first surface of the device layer with a relatively small amount, in other words recessed less than the structures defined by the first intermediate mask (350). These areas correspond to the first recession trenches (220) in the first exemplary embodiment. For example, such structures may include rotors (512) or parts of rotors. The precision requirement for alignment of the first intermediate mask (350) is defined by the minimum line width (w1) of the first trenches (200). An alignment within the exemplary 2 μm that was used in the exemplary design is well achievable with modern methods. Again, this phase may be found to resemble phase 2k of the first exemplary manufacturing process, except that the first intermediate mask (350) is placed on the first face of the device wafer (100), thus defining areas on the first face of the device wafer (100).

Figure 3F:
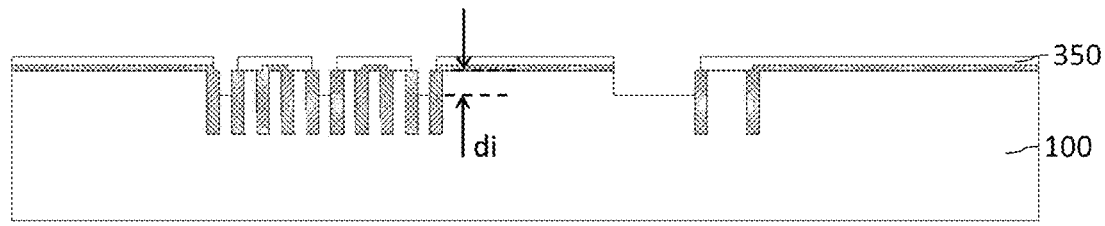

FIG. 3f describes the next phase, where a first intermediate etching step is performed on the first face of the device layer, where the areas where the material of the device wafer (100) are etched to a first intermediate depth (di) that will later be further etched to a third recession depth (d4). In this second exemplary embodiment, the device wafer (100) material in these areas that are first etched to the first intermediate depth (di) will be etched to relatively deep third recession depth (d4), but not through the entire device layer as in the first exemplary embodiment. These areas are etched to a defined first intermediate depth (di), which is less than the current thickness of the device wafer and less than the intended thickness of the device layer (d1). In the exemplary design, where the final device layer thickness is in level of 35 μm, this intermediate depth (di) may equal 15 μm. The used intermediate depth (di) may be optimized for accuracy of the masking process. The deeper the intermediate etching step is, the thicker the first intermediate mask (350) must be, since the mask layer is also affected by the etching process. Although the mask can be made thicker, the accuracy of the mask will reduce with the thickness of the mask photoresist material layer. Thus, the first intermediate mask layer (350) thickness is adjusted to balance between requirement for accuracy of alignment and allowed depth of etching with the used mask. It may be noticed that phase illustrated by FIG. 3f resembles with phase illustrated earlier in phase 2l, except that this intermediate etching step is performed on the first face of the device wafer (100). The depths of the intermediate etching phases (di, di') on different faces of the device wafer (100) may be the same or they may be different.

Figure 3G:
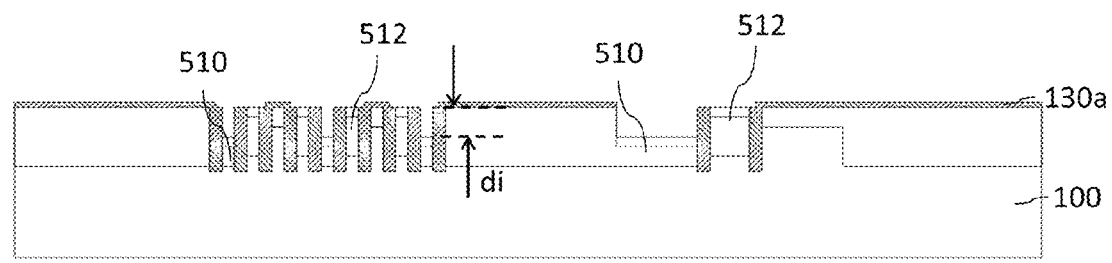

In FIG. 3g, the first intermediate mask (350) is removed, exposing the patterned first recession mask (130a) that was created in step described in connection to FIG. 3d. The removal of the first intermediate mask (350) may be implemented by any method known by a person skilled in the art, as described above. Again it may be noticed that this phase resembles phase 2m, except that the first recession mask (130a) is on the first face of the device wafer (100).

FIG. 3g further illustrates the nature of the first intermediate etching step with the marked outlines of the target structures marked in the volume of the device wafer (100). It may be noticed that towards the first face of the device wafer (100), there is still excess device wafer material on top of both the first stators (510) and the rotor (512). This extra material will be etched away during the next etching phase, namely the final recession etching on this face of the device wafer (100).

Figure 3H:
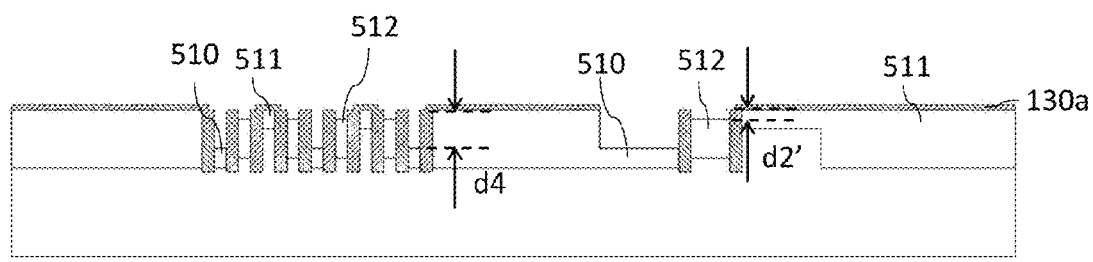

FIG. 3h describes the first recession etching step, creating at least a number of first recession trenches, and also increasing recession depth of the third recession trenches earlier recessed to the first intermediate depth (di), so that their depth no corresponds to the intended third recession depth (d4). Again, the target final structures have been illustrated in the volume of the device wafer (100), although the faces of the structures towards the second face of the device wafer (100) are yet to be processed. In this step, the first recession mask (130a) formed from the deposited silicon oxide layer (130) is used as the pattern for etching. The second recession etching phase is preferably performed using a dry etching method such as DRIE etching. In this step, the areas of the device wafer (100), i.e. the first recession trenches, that correspond to device structures whose surface at the first side of the device wafer are recessed to a first recession depth (d2') below the first face of the device wafer (100). We may call these as the first recession trenches as the first recession trenches similarly to the first recession trenches (220) created in phase 1g, as these are created with the first recession mask, and the etching step starts from the original first face of the device wafer (100). In this exemplary design, these areas may correspond to the rotors (512), the first face of which may be at least partially recessed for example 5 μm below the first face of the device wafer (100). With at least partially recessing we mean that some structures may have areas that are recessed while the same structures may have areas that are not recessed, or are recessed to a different depth. At the same time with etching the first recession trenches, the areas where device wafer material is to be recessed to a third recession depth (d4) below the first face of the device wafer (100) are etched to their final depth. In this example these areas correspond to the first stators (510), the first face of which may be at least partially recessed to the third recession depth (d4), for example to a total depth of 20 μm below the first face of the device wafer (100). The third recession depth (d4) corresponds to the sum of the depths of the first intermediate etching (di) and the depth of the first recession etching (d2'). It may be noticed that step 3h resembles step 2n in the first exemplary manufacturing process, except that this step is performed on the first face of the device wafer (100). In addition, the third predefined recession depth (d4) is less than the intended thickness of the device layer so that a layer of device wafer (100) material is retained in the areas recessed to the third recession depth (d4).

Figure 3I:
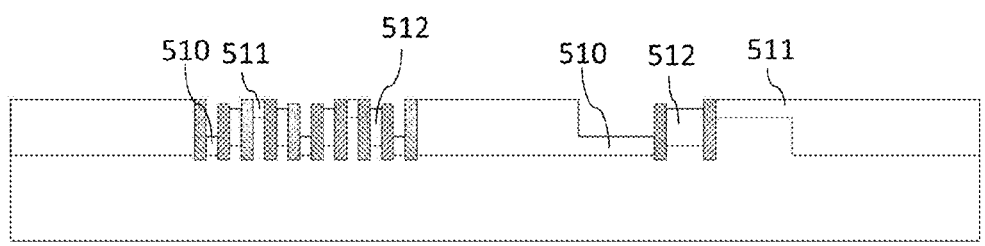

FIG. 3i presents the final step performed on the first face of the device wafer (100), namely removing the first recession mask (130a), thus exposing the device wafer (100) at the first face of the device wafer (100) for further processing. We can now see that there are three kinds of structures defined when viewed from the first face of the device wafer (100); structures (511) that are not recessed below the first face, structures (512) that are at least partially recessed to the first recession depth (d2') below the first face of the device wafer (100) and structures (510) that are at least partially recessed to a third recession depth (d4) below the first face, where the third recession depth (d4) is greater than the first recession depth (d2').

The manufacturing process now continues by flipping the device wafer (100) over so that the second face of the device wafer (100) is on top and exposed for processing. This corresponds to FIG. 2a. Is should be understood, that the structure of the device wafer (100) has not changed from situation presented in FIG. 3i, just the orientation of the device wafer (100).

Next phases of the second exemplary manufacturing process correspond to the phases described in FIGS. 2a to 2m. Any number of vias or plugs may optionally be manufactured similarly to the first exemplary manufacturing process. As a result of these phases, the device wafer (100) is bonded to a handle wafer (300), and after grinding and polishing, the second face of the device wafer (100) forms a planar surface exposing the device wafer material and the pattern formed by the filled first trenches (200). The final device layer thickness in the second exemplary manufacturing process may be chosen as in the first exemplary manufacturing process. For example a final device layer thickness of 30 μm may be chosen.

Figure 4A:
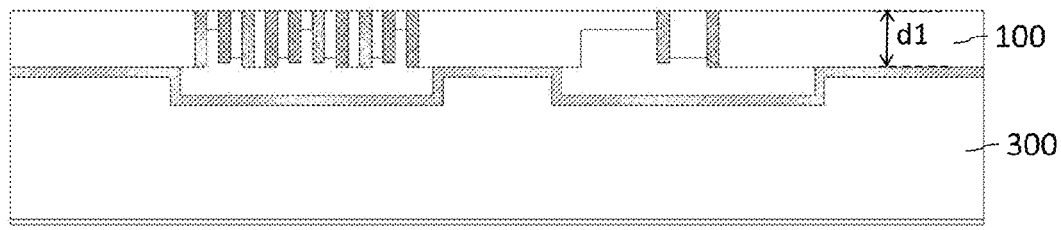
FIGS. 4a to 4d illustrate further steps of the second exemplary manufacturing process for the first alternative embodiment.
Figure 4B:
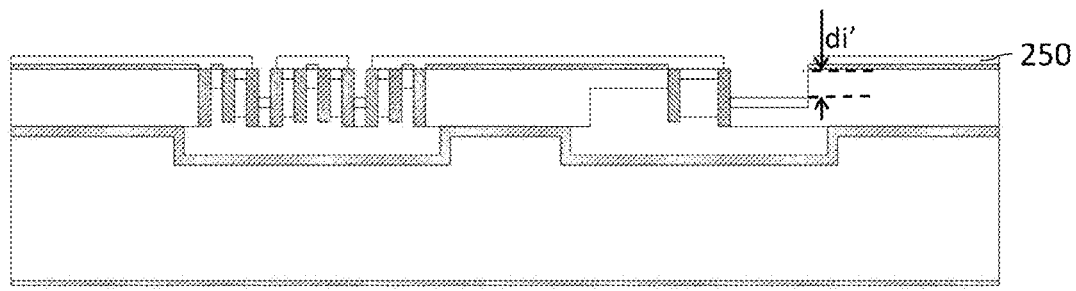

FIG. 4b illustrates phase of the second exemplary manufacturing process corresponding to FIG. 2l. The device wafer (100) has now been attached to a handle wafer (300) and grinded and polished to the final device layer thickness (d1). In phase illustrated in FIG. 4b, a second intermediate etching step has been performed, now on the second face of the device wafer (100), where the areas where the material of the device wafer are etched to a second intermediate depth (di') that will later be further etched to a fourth recession depth (d4'). We may call these areas as the fourth recession trenches. In this second exemplary embodiment utilizing double mask etching, the device wafer (100) material in these areas corresponding to the fourth recession trenches that are first etched to the second intermediate depth (di') will be etched to a relatively deep recession depth. The fourth recession trenches are first etched to the second intermediate depth (di'), which is less than the current thickness of the device wafer and less than the intended thickness of the device layer. In the exemplary design, where the final device layer thickness is in level of 35 μm, this second intermediate depth (di') may equal 15 μm. The second intermediate depth (di') may be equal to the first intermediate depth (di), but the two intermediate depths on opposite faces of the device wafer (100) may also be different from each other. The used second intermediate depth (di') may be optimized for accuracy of the masking process. The deeper the intermediate etching step is, the thicker the respective intermediate mask (350, 250) of photoresist material must be, since the mask layer is also affected by the etching process. Although the mask can be made thicker, the accuracy of the mask will reduce with the thickness of the mask photoresist material layer. Thus, the mask layer thickness is adjusted to balance between requirement for accuracy of alignment and allowed depth of etching with the used mask. It may be noticed that phase illustrated by FIG. 3f resembles with phase illustrated earlier in phase 2l, except for the second intermediate depth (di'), which is defined separately from the first intermediate depth (di), and the two may be equal or different from each other depending on the intended final structure. Again, for illustrative purposes, lines have been drawn in the volume of the device wafer (100) to illustrate the outlines of the final structures. These are already readily defined in the structure at the first face of the device wafer. However, there is still excess device wafer (100) material on top of any structures to be recessed below the second face of the device wafer (100) on the side of the second face of the device wafer.

Figure 4C:
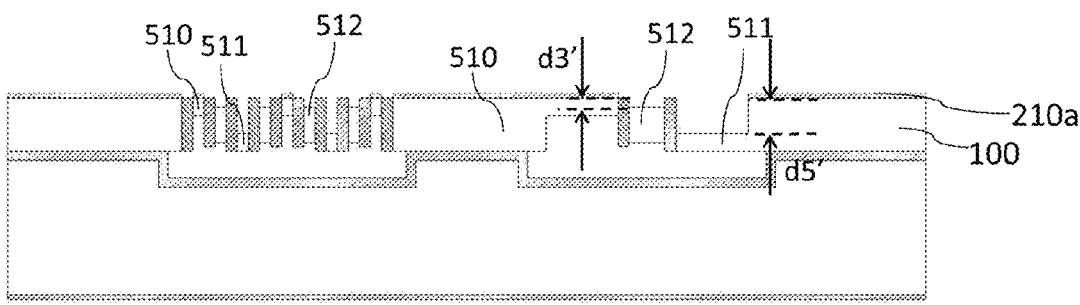

FIG. 4c describes a second recession etching step, creating at least second recession trenches having a second recession depth (d3'). In this step, the second recession mask (210a) formed by the silicon oxide layer (210) is used as the pattern for etching. This etching phase is preferably performed using a dry etching method such as DRIE etching. In this step, the areas of the device wafer (100) that correspond to device structures whose surface at the second side of the device wafer are recessed to a second recession depth (d3') below the second face of the device wafer (100), namely the second recession trenches. For example the rotors (512) are at least partially recessed to the second recession depth (d3'). At the same time with etching the second recession trenches, the areas where device wafer material is to be recessed to the fourth recession depth (d5') below the second face of the device wafer (100), i.e. the fourth recession trenches, are finally etched to their final depth. In this second exemplary manufacturing process, the fourth recession depth (d5') is less than the intended final thickness of the device layer, so that the second stators (511) are formed that are at least partially recessed to the fourth recession depth (d5'). It may be noticed that FIG. 4c corresponds to FIG. 2n, except that the chosen amount of recession as defined by the second recession depth (d3') corresponding to the second recession depth (d3) of FIG. 2n, and the fourth recession depth (d5') corresponding to the fourth recession depth (d5) in FIG. 2n may be defined differently from those values used in the example of FIG. 2n. Especially, the fourth defined recession depth (d5') of FIG. 4c does not equal to the thickness of the device layer.

Figure 4D:
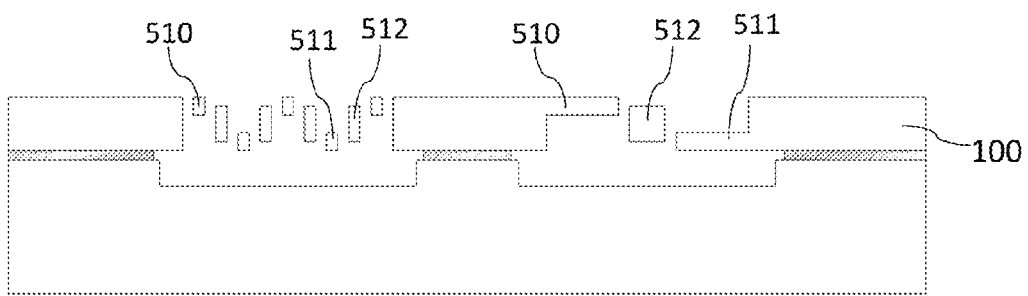

FIG. 4d illustrates the result of the device wafer processing according to the second exemplary manufacturing process. Now all protecting and/or masking oxide layers have been etched away, and the final device layer comprises structures that may have been recessed by varying amounts from either face of the device layer. All movable structures are, however formed from the same, homogenous device wafer (100) material and their side surface structure is also uniform, generated in a common manufacturing step during etching of the first trenches (200). Lateral alignment of the structures in this multi-level comb structure is very precise, as it's entirely defined by the first mask (110) and the first trenches (200). The device wafer may now be placed under a protecting cap wafer in order to protect the device wafer from outside environment. Further, any needed electrodes for driving and detecting may be added as known by a person skilled in the art.

Figure 5A:
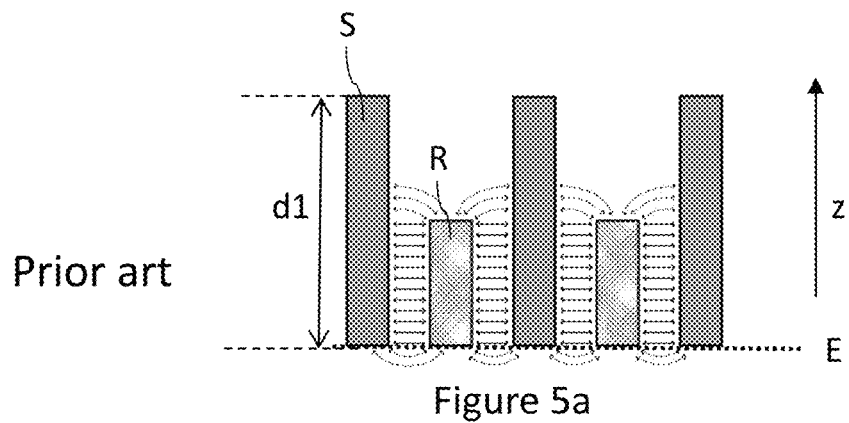
FIGS. 5a to 5c illustrate an example of displacement of a comb electrode recessed on one side only.
Figure 5B:
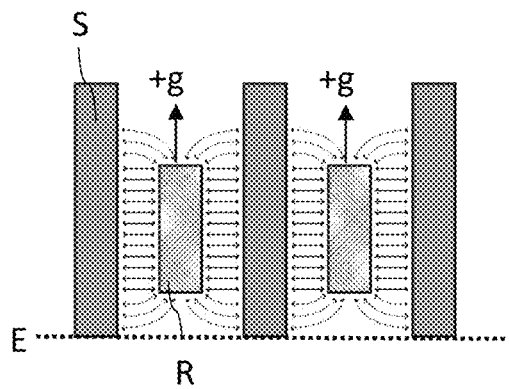
Figure 5C:
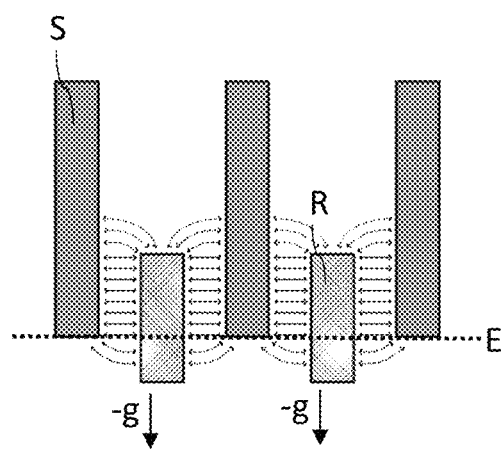
Figure 6:
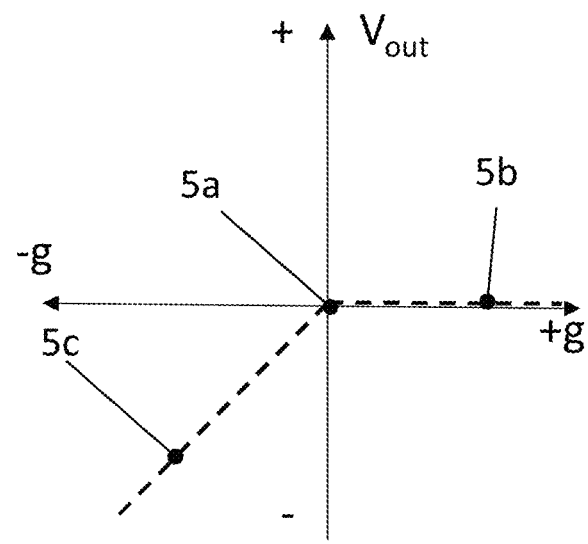
FIG. 6 illustrates a partially linear response function of a sensor device.
Figure 7A:
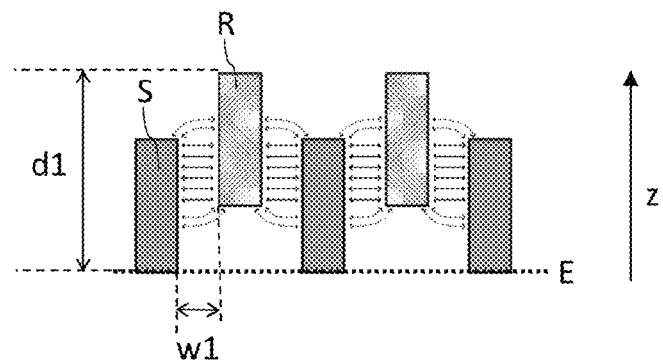
FIGS. 7a to 7c illustrate an example of a fully linear z-displacement measurement with a double recessed comb.
Figure 7B:
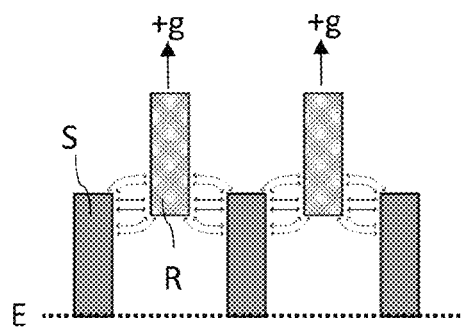
Figure 7C:
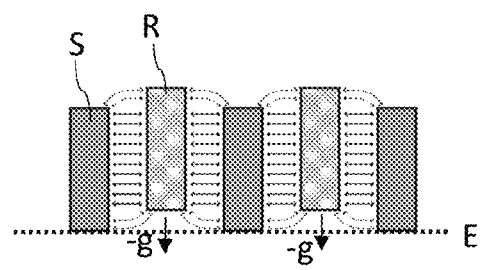
Figure 8:
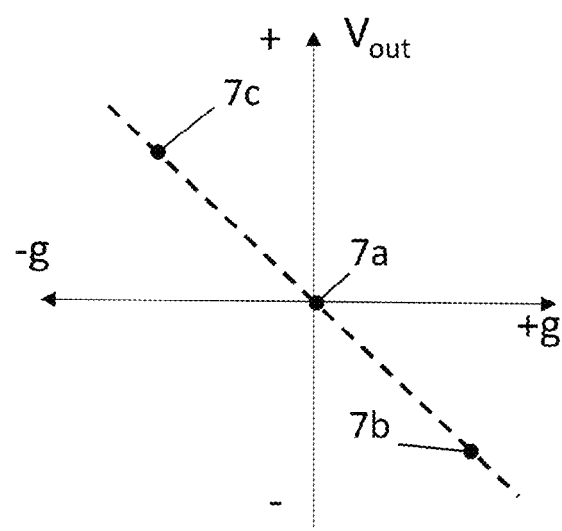
FIG. 8 illustrates a fully linear response function of a sensor device.

FIGS. 5 and 6 describe the problem and FIGS. 7 and 8 the benefit of a fully linear z-displacement measurement enabled by the micromechanical device structure created with the process described in FIGS. 1a to 1h and 2a to 2p.

The comb structure created with the described process may have comb electrodes whose mutual lateral alignment is very precise, and whose mutual vertical positions may be set by the manufacturing process. We'll describe the benefit with a comb electrode pair comprising a least one fixed stator electrode and a moving rotor electrode, both made of same homogenous material wafer and having similar surface structure. However, the method described above allows even creation of two moving electrodes for a comb, both made of same homogenous material wafer and having similar surface structure. Preferably, there is a predefined amount of vertical overlap between the stator and rotor electrodes.

In a traditional MEMS comb manufacturing process, only one side of the device wafer is available for etching. Alignment has been a problem for any double-side processing and it has therefore been avoided.

FIG. 5a illustrates an example of z-displacement measurement principle in a comb structure that is recessed from one (top) side. The stator (S) is now a fixed structure, while the rotor (R) is capable of moving up and down in direction of the z-axis that is illustrated on the right. The final thickness (d1) of the device layer has been indicated in the figure. In FIG. 5a, the comb is in the equilibrium position: the lower edges of the electrodes, defined by the surface of the device wafer, are vertically aligned, while the upper edges of the electrodes may have different heights, if at least one of these have been recessed, but only from one side of the wafer during the manufacturing process. In this case, the rotor (R) has been recessed (more than the stator (S)) so that the vertical height of the rotor (R) is less than the vertical height of the stator (S). Horizontal dotted line (E) marks the position of the lower edge of the electrodes (S, R) in equilibrium position, which is equal to the device layer bottom face. Two-ended horizontal arrows illustrate horizontal electric field lines between the electrodes, and the curved, dotted arrows illustrate fringing electric fields between them.

The capacitance between stator (S) and rotor (R) changes significantly only when the area between the electrodes changes. In FIG. 5b, we can see that when the rotor (R) moves up due to an upward force caused by acceleration (+g) affecting the rotor (R), the overlapping area between the stator (S) and the rotor (R) does not change. Thus, the horizontal electric fields between the electrodes remain unchanged. Only some small capacitance changes may be detected caused by changes in the fringe fields, but these are not suitable for purpose of detecting the movement or position of the rotor (R). In FIG. 5c, the rotor (R) moves down from the initial equilibrium position due to a downward force (−g) affecting it. Now the capacitance between the two electrodes decreases in linear manner, which may be seen as a change in the horizontal electric field lines.

It may be seen that the structure described in FIGS. 5a to 5c is not capable to detect displacement of the rotor (R) linearly in both directions along the z-axis (up or down).

FIG. 6 further illustrates the response function of the exemplary sensor comb arrangements presented in FIGS. 5a to 5c. Acceleration affecting the sensor element and especially its rotor (R) is shown on the horizontal axis, and the output voltage on the vertical axis. This output voltage is proportional to the capacitance between the comb electrodes (R, S). The response function of the sensor element is illustrated with the dashed line. In rest (in equilibrium), the output voltage of the sensor element may be calibrated for example to show zero voltage, corresponding the origin of the graph, marked with a reference to FIG. 5a. It is understood that this output voltage value may be freely chosen, and may also deviate from zero. When the overlapping area between the stator (S) and the rotor (R) decreases due to negative acceleration as in FIG. 5c, also the output voltage decreases linearly, i.e. negative output voltages are received. However, a problem is that when the stator (S) and rotor (R) areas fully overlap, there response function of the device becomes flat: in situation like in FIG. 5b, the output voltage of the sensor remains unchanged even if the rotor (R) moves. It should be noticed, that the same principle works also for driving purposes: by feeding an alternating voltage to the two electrodes, a force caused by the electric field between them may be adjusted that causes movement of the moveable part (rotor) of the comb. Changing the voltage of electrodes (S, R) when they already fully overlap does not cause any significant change in their relative position. We can say that this response function is partially linear.

FIGS. 7a to 7c describe an example of a linear z-displacement measurement enabled by a comb electrode structure recessed from both faces of the device wafer. This illustration may represent a two-level comb electrode, where each of the electrodes are recessed from either face of the device layer, or one electrode pair of a three-level or multi-level comb electrode. Direction of the z-axis is illustrated on the right of FIG. 7a. Thickness (d1) of the device layer has been indicated in FIG. 7a, corresponding to the minimum depth of the first trenches (200) described in the manufacturing process described above. It may be noticed that both electrodes (S, R) have a horizontal face that has been recessed below a different surface of the device layer: the stator (S) has been recessed below the bottom face of the device layer, and the rotor (R) has been recessed below the top face of the device layer. Horizontal dotted line (E) marks the position of the lower face of the device layer in equilibrium position. It may be noticed that the stator (S) is here recessed from this lower face, while the rotor (R) has been recessed from the upper face of the device layer. Two-ended horizontal arrows illustrate horizontal electric field lines between the electrodes, and the curved, dotted arrows illustrate fringing electric fields between them.

The lateral distance between any two fingers of the comb electrode is w1, defined by the first deep trenches. Although we have shown examples where each deep trench has the same width, a person skilled in the art understands that a micromechanical device design may be made having varying width of the first trenches. Now, a preset amount of overlap less than the height of either of the electrodes (S, R) may be built in the structure, so that in equilibrium position (when neither of the electrodes have moved), the electrodes have a defined amount of vertical overlap. When the rotor (R) moves up as in FIG. 7b due to an upward force (+g) affecting it, the horizontal overlapping area between the electrode fingers becomes smaller, which may also be seen as a decrease of the horizontal electric field lines, and the capacitance decreases. the rotor (R) moves down as in FIG. 7c due to a downward force (−g) affecting it, the area between the electrode fingers becomes larger, which may also be seen as an increase of the horizontal electric field lines, and the capacitance increases. Thus, displacement in both directions causes a linear, measurable change in the capacitance, which may be used to measure the displacement of the rotor.

The vertical heights of the electrodes and the amount of vertical overlap in the equilibrium position sets a limit to the amount of displacement that is allowed to stay in the linear capacitance change area of each electrode pair.

FIG. 8 further illustrates the improved linearity of the response function of a multi-level sensor element illustrated in FIGS. 7a to 7c. Acceleration affecting the sensor element, causing displacement of the rotor (R), is shown on the horizontal axis, and the output voltage on the vertical axis. This output voltage is proportional to the capacitance between the comb electrodes (S, R). The response function is illustrated with the dashed line. At rest (in equilibrium), the output of the sensor element may be calibrated for example to show zero voltage, corresponding to the origin of the graph, marked with a reference to FIG. 7a. When the overlapping area between the stator (S) and the rotor (R) decreases due to positive acceleration +g as in FIG. 7b, the output voltage decreases linearly. A point 7b on the response function illustrates output voltage value received from a situation as shown in FIG. 7b. When the overlapping area between the stator (S) and the rotor (R) increases due to negative acceleration −g as in FIG. 7c, the output voltage decreases linearly. It can be said that the output of the sensor device is fully linear. Vertical overlap between the stator (S) and rotor (R) elements define the range of linear response function of the sensor element. It should be noticed that same principle applies also for a driving device such as an actuator. By causing a variable voltage to the electrodes, a variable electric field is caused between the electrodes causing deflection for the rotor part. When the change of the electric field is linear and the comb is within the linear operation range, the change of the position of the rotor (R) is also fully linear.

A two-level comb structure as illustrated in FIGS. 7a to 7c enables having fully linear detection with just one comb structure. This is an important benefit, only available with a multi-level comb structure having electrode fingers on at least two different finger levels, meaning that both electrodes are located on a different level in relation to the z-axis. Such different levels in relation to the z-axis may refer to any of mutual relation of top surfaces of the electrodes, bottom surfaces of the electrodes or even vertical middle levels of the electrodes. Horizontal faces of the electrode fingers are thus on four different levels in equilibrium position. Both fingers (rotor and stator) of the electrode pair vertically overlap only partially with the other electrode finger when in equilibrium position. Alternative solutions for achieving similar type of fully differential detection requires more complicated comb structures, for example combining signals received from two different two-level comb arrangements like in FIG. 5a, where one horizontal face of the two different electrodes of the comb is vertically aligned on the same level. For this, two-level comb arrangements of FIG. 5a need to be arranged next to each other and electrical potentials of the electrodes (stator and rotor) of the two combs are cross-connected so that they have opposite directions. However, need for two combs for such solution roughly doubles the area required for the structure when compared to a two-level comb solution of FIGS. 7a to 7c.

The linearity of the capacity change in an arrangement according to FIGS. 7a to 7c may further be improved by making sure that the comb electrodes are made of homogenous material and that the surfaces of the electrodes have similar structure. The latter may be achieved by ensuring that the surfaces of the electrodes mutually facing each other are created with the same process.

A linear capacitance change enabled by the double side recessed comb structure area between the electrodes changes in both directions, and it may be designed to increase or decrease for a given direction of motion. By improving the achieved capacitance change into more ideal, signal linearity is improved, providing improved movable element performance, for example reduced offset temperature drift, bias stability, G-sensitivity and higher signal levels. Higher signal levels are enabled by lower stray capacitance and/or fixed capacitance in the electrodes.

Further improvement of linear detection may be achieved by using a multi-layer comb structure generated using the second exemplary manufacturing method, utilizing the double mask etching process at both faces of the device wafer as illustrated above.

Figure 9:
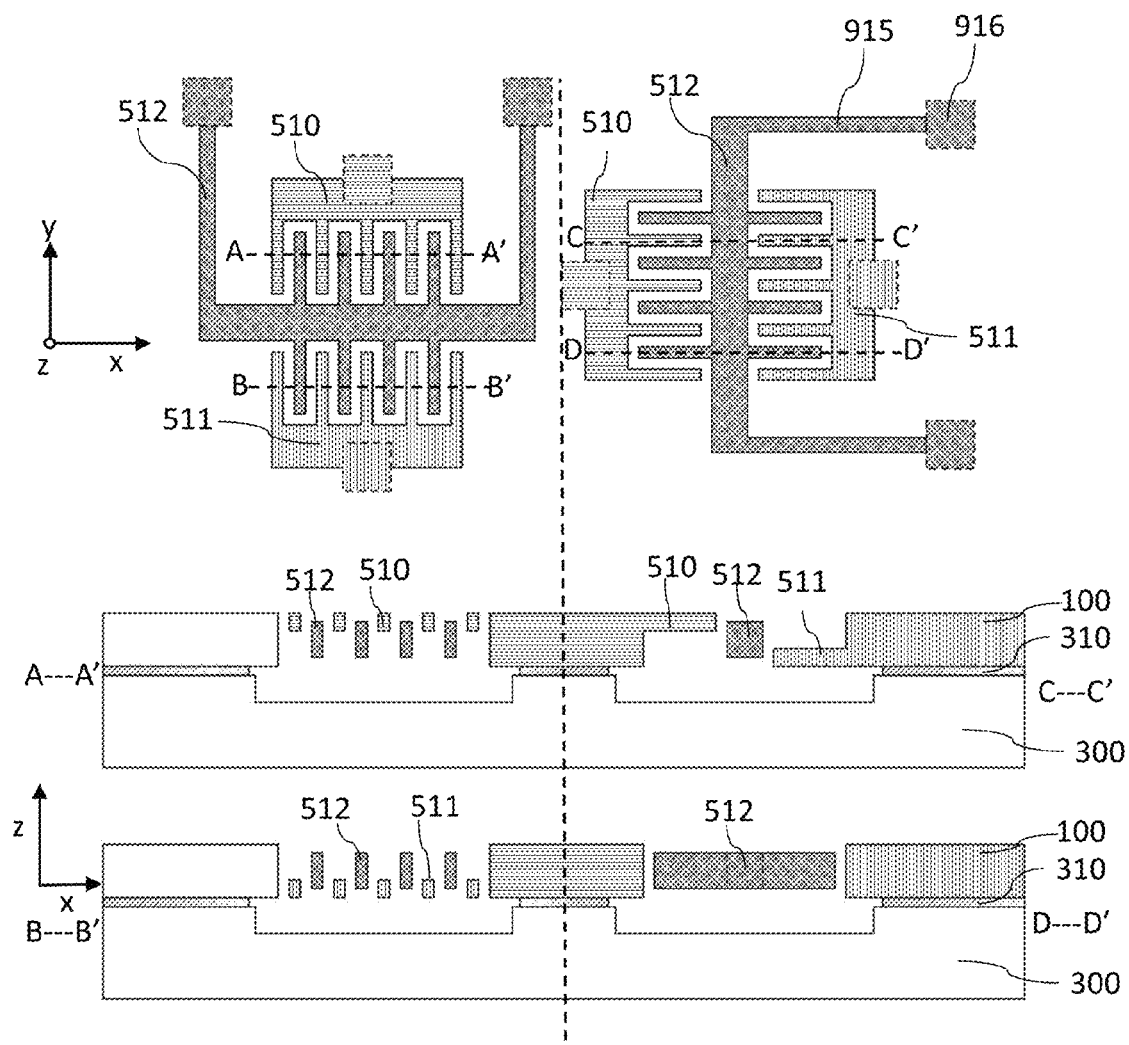
FIG. 9 presents an example of a three-level (multi-level) comb structure.

FIG. 9 presents an example of a three-level (multi-level) comb structure that may be manufactured with the second exemplary manufacturing method as described. Two like three-level comb structures are presented with a 90° angle rotation between them in order to illustrate the structure. A rotor (512) structure that has been recessed from both faces of the device layer is attached to suspension structures (915) with springs (916), which allow the rotor (512) to move in z-axis direction, i.e. in direction of an axis perpendicular to the plane formed by the device layer. The upper part of FIG. 9 illustrates a top view of the device layer as seen from the direction of the second face of the device wafer (xy-plane), whereas the lower part illustrates cross-sections of the device in the xz-plane, showing the device layer formed of the device wafer (100), the handle wafer (300) and the remaining silicon dioxide layer (310) in between. The orientation of the upper part and the lower parts of the figure is also illustrated with the coordinates shown on the left.

Cross-section A-A' illustrates the relative vertical alignment of the rotor (512) and the first stator (510). It may be seen that the first stator (510) is just partially overlapping the rotor (512) in vertical dimension. Thus, the stator-rotor pair formed by the first stator (510) and the rotor (512) have linear z-replacement detection as described in relation to FIGS. 5 and 6. Cross-section B-B' illustrates the relative vertical alignment of the rotor (512) and the second stator (511). It may be seen that the second stator (511) is just partially overlapping the rotor (512) in vertical dimension. Thus, the stator-rotor pair formed by the second stator (511) and the rotor (512) also have linear z-replacement detection as described in relation to FIGS. 5 and 6. But while the two stators are mutually towards opposite face of the rotor, the change of capacitance will occur in opposite direction. The structure may be said to have three different finger levels, in other words, each of the three types of electrodes (rotor, first stator, second stator) is located on a different horizontal level, which horizontal levels are separated from each other vertically by a non-zero distance in direction of the z-axis, and only partially overlaps vertically with the adjacent electrode type. Such different levels in relation to the z-axis, in other words finger levels may be recognized in relation to any one of top surfaces of the electrodes, bottom surfaces of the electrodes and vertical middle levels of the electrodes. Thus, horizontal faces of the electrode fingers of a three-level comb are preferably vertically located on at least five, but even on six different levels in equilibrium position. Both fingers (rotor and stator) of the electrode pair vertically overlap only partially with the respective adjacent electrode finger when in equilibrium position.

Cross-section C-C' illustrate how stators structures (510, 511) may be partially recessed below either of the faces of the device layer. Alternatively, the stator structures (510, 511) may be entirely recessed. Cross-section D-D' show how the rotor structure (512) may be recessed with a set amount below either or both faces of the device layer.

Figure 10A:
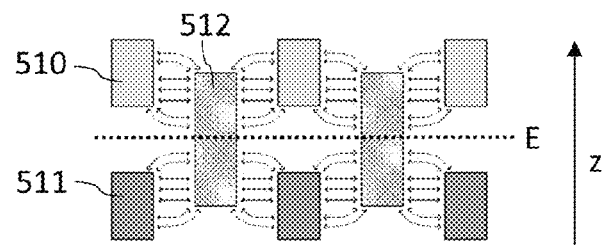
FIGS. 10a to 10c illustrates an example of fully linear displacement measurement with a multi-level comb enabling differential detection.
Figure 10B:
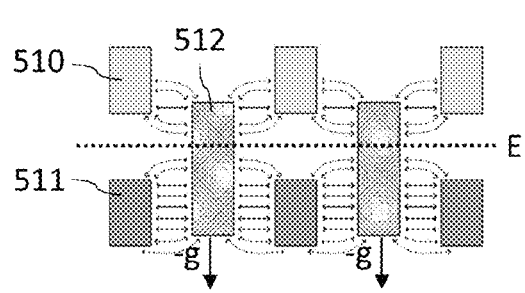
Figure 10C:
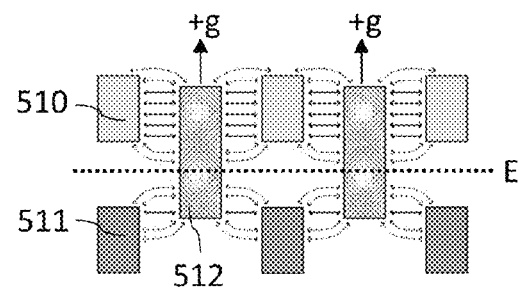
Figure 11:
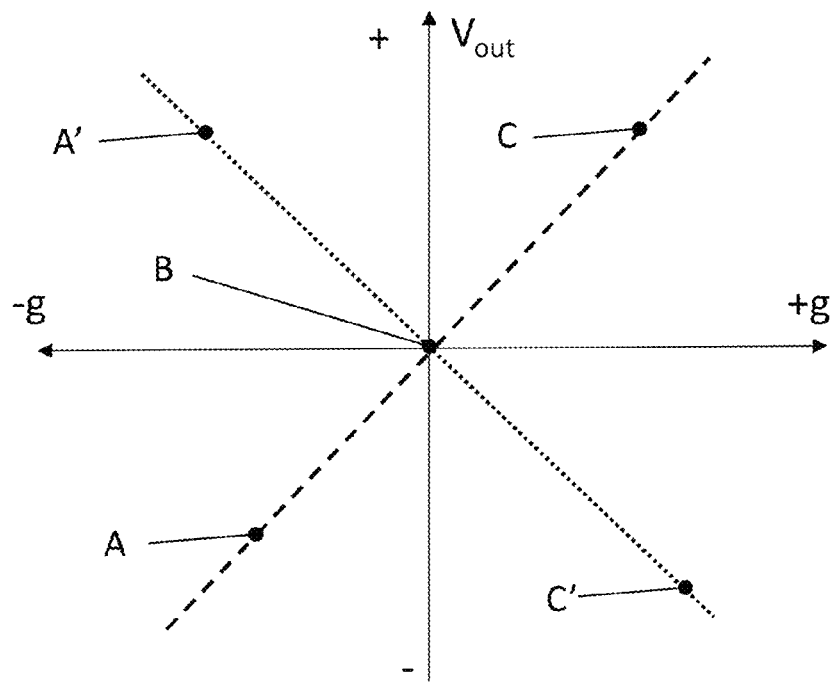
FIG. 11 illustrates the fully linear response function linearity of a multi-level comb structure with differential detection.

FIGS. 10 and 11 illustrate the double linear response function linearity of a three-level comb structure, for example those illustrated in FIG. 4d and later in FIGS. 12a to 12f.

Let's first have a look at FIGS. 10a to 10c. Let's use the same notation as above, so that the upper stator is the first stator (510) and the lower stator is the second stator (511). It should be understood, that although this FIGS. 10a to 10c show stators disposed on different levels along same vertical line, the same principle of response function linearity applies to a structure where stators do not overlap vertically, as shown in the exemplary three-level comb structures of FIGS. 4d and 12a to 12f. For example, structure of FIG. 4d may simply be illustrated by removing one of the first stators and second stators from each vertically aligned pair of stators (510, 511) shown in FIGS. 10a to 10c, so that there is only a single stator remaining between each of the rotor fingers (512) and first stators (510) and second stators (511) alternate in the comb structure between consecutive rotor fingers (512). The rotor (512) is initially in rest (in equilibrium position) and the output voltage of both stators have been calibrated to be in the origin (B). We have marked the equilibrium position with a dotted line (E), now placed vertically in the middle of the structure. Structure may be considered symmetrical with respect to the level of the E-line. It should be noted, that although FIGS. 10a to 10c show both the first stator (z-axis direction has been marked on the right side of FIG. 10a, and this direction is common for FIGS. 10a to 10c. The horizontal electric fields between the electrodes have been illustrated with horizontal two-ended arrows, and the fringing electric fields at or near the vertical ends of the electrodes (510, 511, 512) have been illustrated with the curved, dotted two-ended arrows between the electrodes.

In FIG. 11, the response function of the first stator (510) is marked with a dashed line, and the response function of the second stator (511) is marked with a dotted line. When the rotor (512) is affected by a negative acceleration (−g), the rotor (512) moves down towards negative z-axis. This causes the vertically overlapping area between the rotor (512) and the first stator (510) to decrease and the vertically overlapping area between the rotor (512) and the second stator (511) to increase as seen in FIG. 10b. Thus, the output signal received from the first stator (510) will linearly decrease and the output signal received from the second stator (511) will linearly increase. The change in the electrical fields between the respective electrode pairs (510,512; 511,512) can be clearly seen as a change in the amount (strength) of the electrical field. Output voltage received in the position presented in FIG. 10b is marked in FIG. 11 with exemplary points A and A', respectively. When the rotor (512) is affected by a positive acceleration (+g), the rotor moves up, as illustrated in FIG. 10c. This causes the vertically overlapping area between the rotor (512) and the first stator (510) to increase and the vertically overlapping area between the rotor (512) and the second stator (511) to decrease. Thus, the output signal received from the first stator (510) will linearly increase and the output signal received from the second stator (511) will linearly decrease. This is marked in FIG. 11 with exemplary points C and C', respectively. The change in the output signals may be characterized as being caused by a change of the mutual capacitance between each electrode pair, which may further be measured as a change of output voltage. As both electrode pairs give a linearly changing output signal in both detectable directions of acceleration, a differential output signal is received based on two fully linear response functions of the two electrode pairs. In equilibrium, the capacitance Cs1 of the first stator (510) is in nominal value $C_{s1}=C_{s10}$ and the capacitance of the second stator (511) is in nominal value $C_{s2}=C_{s20}$. When there is no rotor motion, capacitances match $C_{s10}=C_{s20}$. When $-g$ is applied to the device, the rotor (512) moves down towards the negative z-axis, so that the capacitance $C_{s2}$ between the lower second stator (511) and the rotor (512) increases and the capacitance $C_{s1}$ between the upper first stator (510) and the rotor (512) decreases. Thereby the differential capacitance is $\Delta C = \Delta C_{s2} - \Delta C_{s1} = C_{s20} + \Delta C_{s2} - (C_{s10} - \Delta C_{s1}) = 2\Delta C_{s2}$, if $\Delta C_{s2} = \Delta C_{s1}$.

FIGS. 12a to 12f illustrate some exemplary variations of a multi-level comb structure that may be manufactured using the illustrated manufacturing method by adjusting the thickness of the device layer and the depths of the different etching phases.

Figure 12A:
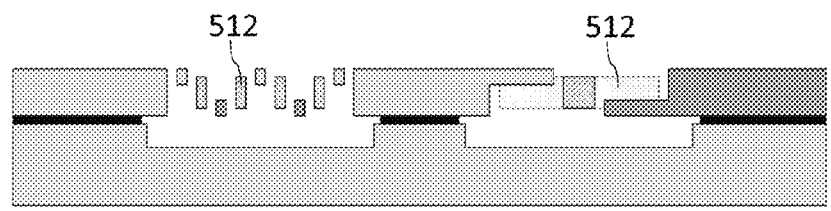
FIGS. 12a to 12f illustrate exemplary variations of a multi-level comb structure.

FIG. 12a corresponds to the reference structure as manufactured according to the second exemplary manufacturing method. The rotor (512) structure is uniformly recessed from both faces of the device layer, and the stators (510, 511) have been recessed in areas of the stator fingers.

Figure 12B:
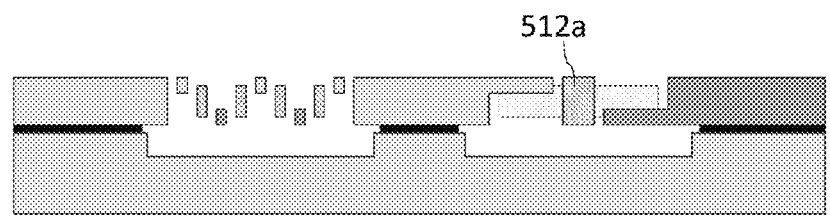

FIG. 12b illustrates a first variation of the reference structure, where the center part (512a) of the rotor (512) has been recessed less than the fingers of the rotor, or where the center part (512a) of the rotor (512) has not been recessed below the faces of the device layer. For creating such additional recession not matching in depth with any of the other recession depth, at least one additional intermediate masking and etching phase may be performed on each side of the device wafer (100). This is one example on how the rotor (512) mass may be increased, so that there is more movable mass in the rotor (512). For example, in case of accelerometer more rotor mass means more vertical displacement and wider measurement range. Alternatively, mass added in the center part of the rotor can be reduced from the rotor center part xy-dimensions, making the chip area required for the rotor structure smaller and thus enabling reducing the size of the entire micromechanical device.

Figure 12C:
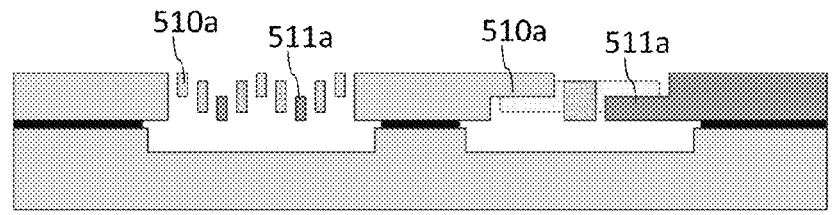

In FIG. 12c, the stator fingers (510a, 511a), the exemplary recessed areas of the stators, have been made thicker in z-dimension than in the design illustrated with FIG. 12a, allowing a greater range for the detection of movement in z-axis direction than with very thin stator combs as may be seen in the cross-section C-C'. By etching the recession of different areas of the device wafer from either side, the lower face of the first stator fingers (510a) has been vertically set to the same level as the upper face of the second stator fingers (511a). Adjusting the depth of recession of the stator fingers (510a, 511a) may be managed in the manufacturing process by adjusting the etching depths in different phases, so that no additional manufacturing steps may be required for this structural change. Further, the rotor (512) center has been recessed from one face of the device layer together with the rotor finger recession, and rotor fingers has been recessed more than the rotor center from the other face of the device layer. For creating such additional recession for some rotor parts not matching in depth with any of the other recession depth, at least one additional intermediate masking and etching phase may be performed.

Figure 12D:
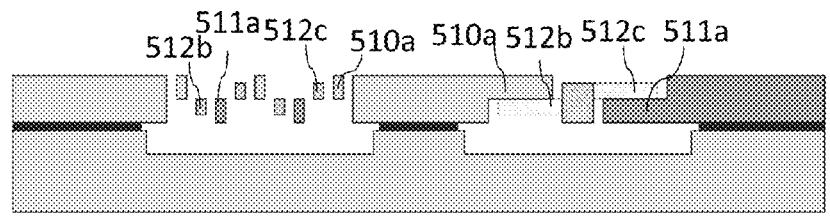

In FIG. 12d, a structure is presented where the rotor fingers (512b, 512c) have been staggered so that the upper edge of rotor finger 512b is in same level with the lower edge of the lower edge of the first stator finger (510a), and the lower edge of rotor finger 512c is in same level with the upper edge of the second stator finger (511a). Now the general form of the response function is different: each comb electrode pair has a response function reminding of the response function described in relation to FIG. 6, except that each of the two electrode pairs (510a, 512b; 511a, 512c) have a response function that is opposite to the other: when rotor (512) moves up, the output of the first electrode pair (510a, 512b) is linearly growing, while the output of the second electrode pair (511a, 512c) is flat and vice versa. In combination, a linear output response function is achieved, although each electrode pair (510a, 512b; 511a, 512c) individually is capable for detecting movement in only one direction from the equilibrium position.

Figure 12E:
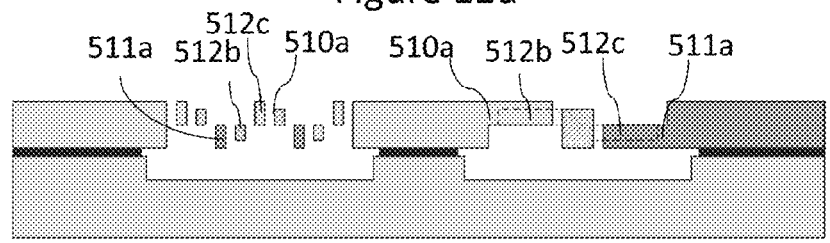

FIG. 12e presents another variation of the structure, where the rotor finger staggering is opposite to the one presented in FIG. 12d. Now the lower edges of rotor finger 512b and the finger of the first stator (510a) are in same level, and the upper edges of rotor finger 512c and the finger (511a) of the second stator (511) are in the same level. Now the general form of the response function opposite from the one presented in FIG. 12d. Each comb electrode pair (510a, 512b; 511a, 512c) has a response function reminding of the response function described in relation to FIG. 6, except that each of the two electrode pairs have a response function that is opposite to the other: when rotor (512) moves up, the output of the first electrode pair (510a, 512b) is flat, while the output of the second electrode pair (511a, 512c) is linearly decreasing and vice versa. In combination, a linear output response function is achieved, although each comb electrode pair (510a, 512b; 511a, 512c) individually is capable for detecting movement in only one direction from the equilibrium position.

Figure 12F:
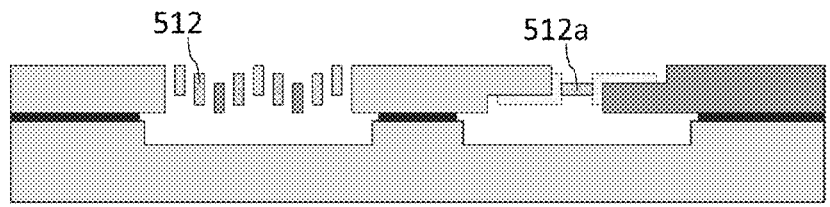

FIG. 12f illustrates a variation of the structure where the center part of the rotor (512a) has been at least partially recessed. For creating such additional recession for some rotor parts not matching in depth with any of the other recession depth, at least one additional intermediate masking and etching phase may be performed.

Although the examples have presented structures intended mainly for driving or detecting vertical rotor motion, accurate lateral dimensions achieved with the method allow even creating structures suitable for driving and/or detecting motion in vertical dimension, i.e. in the xy-plane of the micromechanical device. In such case, the change of the capacitance between the electrodes is based on change of the distance between the electrodes.

By using the self-alignment double sided manufacturing process according to the presented embodiment, the design of the comb electrodes is highly adjustable: the amount of vertical overlap of the comb electrodes may be adjusted with the etching depths from the two faces of the device wafer, and the relative, carefully set lateral (horizontal) distances between the comb electrodes may be adjusted with high precision using a single high precision mask defining the lateral dimensions of the design. While the manufacturing process may define very accurate, small lateral distances, the comb electrodes may be designed to be very tense, saving chip area.

Double side recessed comb structure offers application design freedom. One of the key features is that the created structure may be mass balanced; the masses of the electrodes may be made equal. No dead (non-functional) mass needs to be added on the design for stabilization reasons and micromechanical device area in the xy-plane can be decreased. The double side recessed design may be made fully symmetric, which leads to increased design shrinking, allowing smaller structures. In an exemplary product, change from a traditional single side recessed structure to a new double side recessed structure may reduce the micromechanical device element size up to 30%.

With a one-sided etching process, it's rather difficult to create structures in the device that are recessed from different faces of the device wafer, thus also from different faces of the device layer, using a one-sided manufacturing process. Some etching methods, such as the one described in U.S. Pat. No. 7,214,559 enable recessing structures from below, but the process requires additional trenches allowing use of wet etching technique for the structures that are to be recessed from the bottom side of the device, since these structures are etched horizontally.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A method for manufacturing a micromechanical device layer, the method performed on a device wafer comprising a single layer of homogenous material, the method comprising:
   a) patterning a first mask on a first face of the device wafer, the first mask patterning at least lateral dimensions of comb structures and outlines of large device structures;
   b) etching first trenches using the first mask, the first trenches defining the lateral dimensions of the at least comb structures and outlines of large device structures in a single deep etching process, the first trenches having a first depth;
   c) filling the first trenches with a deposit layer;
   d) patterning at least a first recession mask on the first face of the device wafer, the first recession mask defining at least first areas of the device wafer where the surface of the device wafer is to be recessed below a first surface of the device wafer;
   e) etching at least first recession trenches on the first areas, using the first recession mask, the first recession trenches having a first recession depth and being adjacent to the first trenches filled with the deposit layer;
   f) patterning at least a second recession mask on a second face of the device wafer, the second recession mask defining at least second areas of the device wafer where the surface of the device wafer is to be recessed below a second surface of the device wafer;
   g) etching at least second recession trenches on the second areas, using the second recession mask, the second recession trenches having a second recession depth and being adjacent to the first trenches filled with the deposit layer; and
   h) removing the deposit layer added in step c) to release the movable parts of the micromechanical device layer only after etching the first and the second recession trenches.

2. The method for manufacturing micromechanical structures according to claim 1, wherein at least some of the first recession trenches and the second recession trenches are laterally limited by the first trenches filled with the deposit layer.

3. The method for manufacturing micromechanical structures according to claim 1, further comprising: after step e), reducing thickness of the device wafer into a thickness corresponding to an intended final thickness of the micromechanical device layer.

4. The method for manufacturing micromechanical structures according to claim 3, further comprising:
   before reducing the thickness of the device wafer, turning the device wafer upside down; and
   attaching the device wafer to a handle wafer by fusion bonding.

5. The method according to claim 1, wherein
   the first depth is equal to or greater than an intended final thickness of the micromechanical device layer;
   the first recession depth is equal to an intended amount of recess of the structural elements of the micromechanical device layer that are to be recessed below the first surface of the micromechanical device layer; and wherein
   the second recession depth is equal to the intended amount of recess of the structural elements of the micromechanical device layer that are to be recessed below the second surface of the micromechanical device layer.

6. The method of claim 3, wherein
   the reducing the thickness of the device wafer into a thickness corresponding to the intended final thickness of the micromechanical device layer comprises at least one step of grinding or polishing or partial etching; or
   the reducing the thickness of the device wafer results in an essentially planar second surface of the device layer for subsequent patterning to be performed on the second surface.

7. The method according to claim 1, wherein
   the patterning of at least one of the first mask, the first recession mask, and the second recession mask is performed using one of a photoresist and a silicon dioxide layer as mask material and using photolithography as a mask patterning method.

8. The method according to claim 1, wherein the step of first trench etching comprises use of an anisotropic etching process, and the steps of recession trench etching comprise use of at least one of an anisotropic etching process and an isotropic etching process.

9. The method according to claim 1, wherein the first etching results in first trenches that have a width between 1 μm and 8 μm, the width of the first trenches defining lateral separations between the comb fingers and movable parts.

10. The method of claim 1, wherein the filling the first trenches defining the comb structures and outlines of larger device structures with the deposit layer results in an essentially planar surface on the first face of the device wafer for subsequent patterning steps to be performed on the first surface.

11. The method according to claim 1, wherein the first trenches further define the lateral outlines of any functional elements to be created from the device wafer, the functional elements including at least one of movable elements and suspension structures.

12. The method according to claim 11, wherein the functional elements comprise any of movable masses, springs, combs, limiters, bars, levers, and the suspension structures.

13. A method for manufacturing a micromechanical device layer, the method performed on a device wafer comprising a single layer of homogenous material, the method comprising:
   a) patterning a first mask on a first face of the device wafer, the first mask patterning at least lateral dimensions of comb structures and outlines of large device structures;
   b) etching first trenches using the first mask, the first trenches defining the lateral dimensions of the at least comb structures and outlines of large device structures in a single deep etching process, the first trenches having a first depth;
   c) filling the first trenches with a deposit layer;
   d) patterning at least a first recession mask on the first face of the device wafer, the first recession mask defining at least first areas of the device wafer where the surface of the device wafer is to be recessed below a first surface of the device wafer;

patterning a first intermediate mask on top of the first recession mask on the first face of the device wafer, the first intermediate mask defining third areas of the device wafer where the device wafer is to be recessed to a third recession depth, the third recession depth being greater than the first recession depth; and e) etching at least first recession trenches on the first areas, using the first recession mask, the first recession trenches having a first recession depth and being adjacent to the first trenches filled with the deposit layer;

f) patterning at least a second recession mask on a second face of the device wafer, the second recession mask defining at least second areas of the device wafer where the surface of the device wafer is to be recessed below a second surface of the device wafer;

g) etching at least second recession trenches on the second areas, using the second recession mask, the second recession trenches having a second recession depth and being adjacent to the at least first recession trenches filled with the deposit layer;

etching third recession trenches on the third areas, using the first intermediate mask, to a first intermediate depth that is less than the third recession depth;

further etching the third recession trenches using the first recession mask in step e) simultaneously with etching the first recession trenches to the first recession depth, in order to increase the depth of the third recession trenches to a depth equal the third recession depth; and h) removing the deposit layer added in step c) to release the movable parts of the micromechanical device layer only after etching the first, the second and the third recession trenches.

14. The method for manufacturing micromechanical structures according to claim 13, wherein at least some of the third recession trenches are laterally limited by the first trenches filled with the deposit layer.

15. The method according to claim 13, wherein
the third recession depth or the fourth recession depth is less than an intended final thickness of the micromechanical device layer, and less than a thickness of a device layer material on the third areas before the step of etching of the third areas; and
device wafer material at the third areas of the device wafer is fully removed by etching the third recession trenches through the structure in step e).

16. The method according to claim 13, wherein the first intermediate mask is of different material than the first recession mask.

17. A method for manufacturing a micromechanical device layer, the method performed on a device wafer comprising a single layer of homogenous material, the method comprising:

a) patterning a first mask on a first face of the device wafer, the first mask patterning at least lateral dimensions of comb structures and outlines of large device structures;

b) etching first trenches using the first mask, the first trenches defining the lateral dimensions of the at least comb structures and outlines of large device structures in a single deep etching process, the first trenches having a first depth;

c) filling the first trenches with a deposit layer;

d) patterning at least a first recession mask on the first face of the device wafer, the first recession mask defining at least first areas of the device wafer where the surface of the device wafer is to be recessed below a first surface of the device wafer;

e) etching at least first recession trenches on the first areas, using the first recession mask, the first recession trenches having a first recession depth and being adjacent to the first trenches filled with the deposit layer;

f) patterning at least a second recession mask on a second face of the device wafer, the second recession mask defining at least second areas of the device wafer where the surface of the device wafer is to be recessed below a second surface of the device wafer;

patterning a second intermediate mask on top of the second recession mask on the second face of the device wafer, the second intermediate mask defining fourth areas of the device wafer where the device wafer is to be recessed to a fourth recession depth, the fourth recession depth being greater than the second recession depth;

g) etching at least second recession trenches on the second areas, using the second recession mask, the second recession trenches having a second recession depth and being adjacent to the at least first recession trenches filled with the deposit layer;

etching fourth recession trenches on the fourth areas, using the second intermediate mask, to a second intermediate depth that is less than the fourth recession depth;

further etching the fourth recession trenches using the second recession mask in step g) simultaneously with etching the second recession trenches to the second recession depth, in order to increase the depth of the fourth recession trenches to equal the fourth recession depth; and h) removing the deposit layer added in step c) to release the movable parts of the micromechanical device layer only after etching the first, the second and the fourth recession trenches.

18. The method according to claim 17, wherein
the fourth recession depth is less than an intended final thickness of the micromechanical device layer, and less than a thickness of a device layer material on the fourth areas before the step of etching of the fourth areas; and
device layer material at the fourth areas is fully removed by etching the fourth recession trenches through the structure in step g).

19. The method for manufacturing micromechanical structures according to claim 17, wherein at least some of the fourth recession trenches are laterally limited by the first trenches filled with the deposit layer.

20. The method according to claim 17, wherein the second intermediate mask is of different material than the second recession mask.

* * * * *